(12) United States Patent
Tak et al.

(10) Patent No.: US 8,952,419 B2
(45) Date of Patent: Feb. 10, 2015

(54) SEMICONDUCTOR DEVICES AND METHODS OF MANUFACTURING THE SAME

(75) Inventors: Young-jo Tak, Hwaseong-si (KR); Jae-won Lee, Gwacheon-si (KR); Young-soo Park, Yongin-si (KR); Jun-youn Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 46 days.

(21) Appl. No.: 13/236,266

(22) Filed: Sep. 19, 2011

(65) Prior Publication Data

US 2012/0074385 A1    Mar. 29, 2012

(30) Foreign Application Priority Data

Sep. 28, 2010    (KR) .................. 10-2010-0093923

(51) Int. Cl.
| | | |
|---|---|---|
| H01L 21/02 | (2006.01) | |
| H01L 33/00 | (2010.01) | |
| H01L 33/12 | (2010.01) | |
| H01L 33/32 | (2010.01) | |

(52) U.S. Cl.
CPC .... H01L 21/02458 (2013.01); H01L 21/02381 (2013.01); H01L 21/02505 (2013.01); H01L 21/02507 (2013.01); H01L 21/0254 (2013.01); H01L 21/02642 (2013.01); H01L 33/007 (2013.01); H01L 33/12 (2013.01); H01L 33/32 (2013.01)
USPC ............. 257/190; 257/11; 257/189; 257/191; 257/200; 257/201; 257/614; 257/615; 257/616; 257/E33.019; 257/E33.023

(58) Field of Classification Search
None
See application file for complete search history.

(56) References Cited

U.S. PATENT DOCUMENTS

| | | |
|---|---|---|
| 5,874,747 A | 2/1999 | Redwing et al. |
| 6,617,060 B2 | 9/2003 | Weeks, Jr. et al. |
| 6,649,287 B2 | 11/2003 | Weeks, Jr. et al. |
| 7,339,205 B2 | 3/2008 | Piner et al. |
| 7,352,015 B2 | 4/2008 | Piner et al. |
| 7,655,090 B2 | 2/2010 | Marchand et al. |
| 7,687,888 B2 | 3/2010 | Marchand et al. |
| 7,695,625 B2 | 4/2010 | Lyyra et al. |
| 7,816,764 B2 | 10/2010 | Marchand et al. |

(Continued)

FOREIGN PATENT DOCUMENTS

| | | |
|---|---|---|
| DE | 10151092 A1 | 5/2003 |
| DE | 102007020979 | 10/2008 |

(Continued)

OTHER PUBLICATIONS

European Search Report dated Jan. 24, 2012 issued in corresponding European Application No. 11183069.1.

(Continued)

*Primary Examiner* — David Vu
*Assistant Examiner* — Cuong B Nguyen
(74) *Attorney, Agent, or Firm* — Harness, Dickey & Pierce, P.L.C.

(57) ABSTRACT

A semiconductor device includes a substrate, a buffer layer on the substrate, and a plurality of nitride semiconductor layers on the buffer layer. The semiconductor device further includes at least one masking layer and at least one inter layer between the plurality of nitride semiconductor layers. The at least one inter layer is on the at least one masking layer.

34 Claims, 23 Drawing Sheets

(56) References Cited

U.S. PATENT DOCUMENTS

| | | |
|---|---|---|
| 2007/0197004 A1 | 8/2007 | Dadgar et al. |
| 2008/0217645 A1 | 9/2008 | Saxler et al. |
| 2008/0220555 A1 | 9/2008 | Saxler et al. |
| 2009/0104758 A1 | 4/2009 | Weeks, Jr. et al. |
| 2010/0133658 A1 | 6/2010 | Dadgar et al. |
| 2010/0219445 A1* | 9/2010 | Yokoyama et al. ............ 257/101 |
| 2010/0244063 A1* | 9/2010 | Yokogawa et al. ............. 257/94 |
| 2010/0314605 A1* | 12/2010 | Khan .............................. 257/13 |
| 2011/0049544 A1 | 3/2011 | Komada ........................... 257/97 |
| 2011/0220867 A1* | 9/2011 | Khan et al. ...................... 257/13 |

FOREIGN PATENT DOCUMENTS

| | | |
|---|---|---|
| EP | 2112699 A2 | 10/2009 |
| JP | 3352712 B2 | 9/2002 |
| KR | 20080104014 A | 11/2008 |
| KR | 20090128506 A | 12/2009 |
| WO | WO 2007/096405 | 8/2007 |
| WO | WO 2011/039181 | 4/2011 |

OTHER PUBLICATIONS

High quality GaN grown on silicon (111) using a $Si_xN_y$ interlayer by metal-organic vapor phase epitaxy, Cheng et al., 2008, Applied Physics Letters, vol. 92.

Summary of Strategic Application presentation, Samsung Advanced Institute of Technology, 2008.

GaN LED on Si basic structure of SAIT (present invention) presentation, 2011.

European Search Report dated Jun. 4, 2014 issued in correponding European Application No. 1183069.1.

* cited by examiner

SEMICONDUCTOR DEVICES AND METHODS OF MANUFACTURING THE SAME

CROSS-REFERENCE TO RELATED APPLICATION(S)

This application claims priority under 35 U.S.C. §119 to Korean Patent Application No. 10-2010-0093923, filed on Sep. 28, 2010, in the Korean Intellectual Property Office, the entire contents of which are incorporated herein by reference.

BACKGROUND

1. Field

Example embodiments relate to semiconductor devices having reduced dislocation densities and/or tensile stresses. Example embodiments also relate to methods of manufacturing semiconductor devices.

2. Description of the Related Art

Conventional nitride-based semiconductor devices use a sapphire substrate. However, sapphire substrates are relatively expensive and relatively difficult to process. Sapphire substrates also have relatively low electric conductivity. Furthermore, sapphire substrates are relatively difficult to manufacture in relatively large sizes because warping may occur during relatively high temperature processes (e.g., during epitaxial growth) due to the relatively low thermal conductivity.

Other conventional nitride-based semiconductor devices use a silicon (Si) substrate instead of a sapphire substrate. Because silicon substrates have a higher thermal conductivity than sapphire substrates, silicon substrates are not warped significantly at relatively high temperatures while growing a nitride thin film. Accordingly, it is possible to grow a relatively large thin film on a silicon substrate. However, when a nitride thin film is grown on a silicon substrate, a dislocation density may increase due to a mismatch in lattice constants between the silicon substrate and the nitride thin film. Cracks may also form more easily due to the thermal expansion coefficient mismatch between the silicon substrate and the nitride thin film.

It is relatively difficult to obtain both relatively low dislocation density and relatively low crack formation using conventional methods because reducing dislocation density causes residual tensile stress, which causes cracks to form. Moreover, when crack formation is reduced, a dislocation density generally increases using conventional methods. Therefore, reducing both dislocation density and crack formation is relatively difficult when growing a nitride thin film on a silicon substrate.

SUMMARY

Example embodiments provide semiconductor devices, which may have reduced dislocation densities and/or tensile stresses.

Example embodiments also provide methods of manufacturing semiconductor devices.

Additional aspects will be set forth in part in the description which follows and, in part, will be apparent from the description, or may be learned by practice of one or more example embodiments.

At least one example embodiment provides a semiconductor device including at least two stack structures. Each stack structure includes a first nitride semiconductor layer, a first masking layer on the first nitride semiconductor layer, a second nitride semiconductor layer on the first masking layer, and a first inter layer on the second nitride semiconductor layer.

According to at least some example embodiments, the semiconductor device may further include at least one buffer layer between a first of the at least two stack structures and a substrate, and a third nitride semiconductor layer on a second of the at least two stack structures. In this case, the at least two stack structures may be on the substrate.

According to at least some example embodiments, the semiconductor device may further include at least one buffer layer and a third nitride semiconductor layer. A first of the at least two stack structures may be on the at least one buffer layer, and the third nitride semiconductor layer may be on a second of the at least two stack structures.

At least one other example embodiment provides a semiconductor device. According to at least this example embodiment, the semiconductor device includes a first nitride semiconductor layer, a first inter layer on the first nitride semiconductor layer, and at least one stack structure on the first inter layer, the at least one stack structure including a second nitride semiconductor layer, a first masking layer on the second nitride semiconductor layer, a third nitride semiconductor layer on the first masking layer, a second inter layer on the third nitride semiconductor layer, and a fourth nitride semiconductor layer on the second inter layer.

According to at least some example embodiments, the semiconductor device may further include a third inter layer and a fifth nitride semiconductor layer. The first nitride semiconductor layer may be on the third inter layer, and the third inter layer may be on the fifth nitride semiconductor layer. At least one buffer layer may be between the first nitride semiconductor layer and a substrate. In this case, the first nitride semiconductor layer is on the substrate.

According to at least some example embodiments, the first nitride semiconductor layer may be on at least one buffer layer.

At least one other example embodiment provides a semiconductor device. According to at least this example embodiment, the semiconductor device includes at least one first stack structure and at least one second stack structure on the at least one first stack structure. The at least one first stack structure includes a plurality of nitride semiconductor layers and a plurality of masking layers stacked alternately on one another. The at least one second stack structure includes a plurality of nitride semiconductor layers and a plurality of inter layers stacked alternately on the first stack structure.

According to at least some example embodiments, the semiconductor device may further include a plurality of first stack structures and a plurality of second stack structures stacked alternately on one another. The at least one first stack structure and the at least one second stack structure may be on a substrate, and at least one buffer layer may be between the at least one first stack structure and the substrate.

According to at least some example embodiments, the at least one first stack structure may be on at least one buffer layer.

At least one other example embodiment provides a semiconductor device. According to at least this example embodiment, the semiconductor device includes a plurality of nitride semiconductor layers, at least one masking layer between a first pair of the nitride semiconductor layers, and at least one inter layer between a second pair of the nitride semiconductor layers. The at least one inter layer is on the at least one masking layer. According to at least this example embodiment, the inter layer may be configured to compensate for tensile stress.

According to at least some example embodiments, the plurality of nitride semiconductor layers may be formed of a nitride including gallium. The plurality of nitride semiconductor layers may be formed of materials including, aluminum (Al), indium (In), gallium (Ga), nitrogen (N), combinations thereof, or the like. For example, the plurality of nitride semiconductor layers may be formed of $Al_xIn_yGa_{1-x-y}N$ ($0 \leq x \leq 1$, $0 \leq y \leq 1$, $x+y<1$). The at least one masking layer may be formed of a silicon nitride, a titanium nitride, or the like.

The at least one inter layer may be formed of one of $Al_{x0}In_{y0}Ga_{1-x0-y0}N$ ($0 \leq x0 \leq 1$, $0 \leq y0 \leq 1$, $x0+y0 \leq 1$), step-graded $Al_xIn_yGa_{1-x-y}N$ ($0 \leq x \leq 1$, $0 \leq y \leq 1$, $x+y \leq 1$), and $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$ or $y1 \neq y2$) superlattices. The at least one inter layer may be configured to apply a compressive stress to a nitride semiconductor layer on the at least one inter layer.

The plurality of nitride semiconductor layers may be on a substrate. The substrate may be a silicon substrate, a silicon carbide substrate, or the like.

The semiconductor device may further include at least one buffer layer between the substrate and the plurality of nitride semiconductor layers. The at least one buffer layer may include a nucleation-growth layer. The nucleation-growth layer may be formed of aluminum-nitride (AlN).

According to at least some example embodiments, the at least one buffer layer may be formed of $Al_xIn_yGa_{1-x-y}N$ ($0 \leq x \leq 1$, $0 \leq y \leq 1$, $x+y \leq 1$) and/or may have a step-graded structure or a superlattice structure. For example, the at least one buffer layer may be formed of step-graded $Al_xIn_yGa_{1-x-y}N$ ($0 \leq x \leq 1$, $0 \leq y \leq 1$, $x+y \leq 0$) or $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$ or $y1 \neq y2$) superlattices.

The at least one masking layer and the at least one inter layer may form one or more pairs.

The at least one masking layer may be on at least one inter layer. The at least one inter layer may be formed of $Al_xGa_{1-x}N$ ($0.4<x<1$).

At least one other example embodiment provides a semiconductor device. According to at least this example embodiment, the semiconductor device includes a first nitride semiconductor layer, a second nitride semiconductor layer, and a third nitride semiconductor layer. A masking layer is between the first nitride semiconductor layer and the second nitride semiconductor layer, and an inter layer is between the second nitride semiconductor layer and the third nitride semiconductor layer.

At least one other example embodiment provides a semiconductor device. According to at least this example embodiment, the semiconductor device includes a first nitride semiconductor layer, a masking layer on the first nitride semiconductor layer, a second nitride semiconductor layer on the masking layer, an inter layer on the second nitride semiconductor layer, and a third nitride semiconductor layer on the inter layer.

According to at least some example embodiments, each of the first, second, and third nitride semiconductor layers may be formed of a nitride including gallium.

At least one other example embodiment provides a semiconductor device. According to at least this example embodiment, the semiconductor device includes a silicon-based substrate doped with p-type impurities, a buffer layer on the silicon-based substrate, and a nitride stack on the buffer layer.

According to at least some example embodiments, the nitride stack may include a plurality of nitride semiconductor layers, at least one masking layer between the plurality of nitride semiconductor layers, and at least one inter layer between the plurality of nitride semiconductor layers.

According to at least some example embodiments, the nitride stack may include a first nitride semiconductor layer on the buffer layer, a masking layer on the first nitride semiconductor layer, a second nitride semiconductor layer on the masking layer, an inter layer on the second nitride semiconductor layer, and a third nitride semiconductor layer on the inter layer.

The silicon-based substrate may be a silicon substrate, a silicon carbide substrate, or the like. The p-type impurities may include at least one of boron (B), aluminum (Al), magnesium (Mg), calcium (Ca), zinc (Zn), cadmium (Cd), mercury (Hg), gallium (Ga), or the like. In one example, the p-type impurities may be boron (B). A doping concentration of the p-type impurities may be between about $5 \times 10^{17}$ cm$^{-3}$ and about $10^{20}$ cm$^{-3}$, inclusive. For example, a doping concentration of the p-type impurities may be between about $10^{18}$ cm$^{-3}$ and about $5 \times 10^{19}$ cm$^{-3}$, inclusive. In at least one example, the doping concentration of the p-type impurities may be such that a resistivity of the silicon-based substrate is less than or equal to about 1 Ωcm.

At least one other example embodiment provides a method of manufacturing a semiconductor device. According to at least this example embodiment, the method includes: forming a silicon-based substrate by doping a silicon substrate with p-type impurities; forming a buffer layer on the silicon-based substrate doped with p-type impurities; and forming a nitride stack on the buffer layer.

According to at least some example embodiments, the nitride stack may include a first nitride semiconductor layer on the buffer layer, a masking layer on the first nitride semiconductor layer, a second nitride semiconductor layer on the masking layer, an inter layer on the second nitride semiconductor layer, and a third nitride semiconductor layer on the inter layer.

The p-type impurities may include at least one of B, Al, Mg, Ca, Zn, Cd, Hg, and Ga. In one example, the p-type impurities may include B. An impurity doping concentration of the silicon-based substrate may be between about $5 \times 10^{17}$ cm$^{-3}$ and about $10^{20}$ cm$^{-3}$, inclusive. For example, an impurity doping concentration of the silicon-based substrate may be between about $10^{18}$ cm$^{-3}$ and about $5 \times 10^{19}$ cm$^{-3}$, inclusive.

BRIEF DESCRIPTION OF THE DRAWINGS

Example embodiments will become apparent and more readily appreciated from the following description of the accompanying drawings in which.

DETAILED DESCRIPTION

Figure 1A:
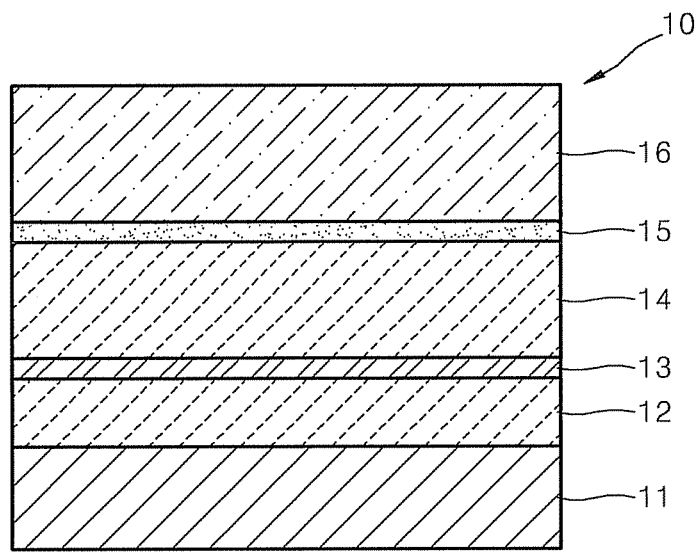
FIG. 1A is a cross-sectional view of a semiconductor device according to an example embodiment.

Various example embodiments will now be described more fully with reference to the accompanying drawings in which some example embodiments are shown. However, specific structural and functional details disclosed herein are merely representative for purposes of describing example embodiments. Thus, example embodiments may be embodied in many alternate forms and should not be construed as limited to only the example embodiments set forth herein. Therefore, it should be understood that there is no intent to limit example embodiments to the particular forms disclosed, but on the contrary, example embodiments are to cover all modifications, equivalents, and alternatives falling within the scope of this disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, exemplary embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, example embodiments are not limited to only the example embodiments described.

A semiconductor device according to at least one example embodiment includes a plurality of nitride semiconductor layers. At least one masking layer is disposed between the plurality of nitride semiconductor layers, and at least one inter layer is disposed between the plurality of nitride semiconductor layers above the at least one masking layer. When a layer is referred to as being "on" or "over" another layer or a substrate, it may be directly on the other layer or the substrate, or intervening layers may also be present therebetween. The nitride semiconductor layers of semiconductor devices according to at least some example embodiments, which are stacked, may be structurally or functionally different from one another. For example, the nitride semiconductor layers may be different from one another structurally by being located at different positions and the nitride semiconductor layers may be different from one another functionally by having different growth characteristics and compositions or different doping concentrations and doping types. For example, to be structurally different, a nitride semiconductor layer may be located over or above the masking layer or the inter layer while another nitride semiconductor layer may be located under or below the masking layer of the inter layer.

FIG. 1A is a cross-sectional view of a semiconductor device 10 according to an example embodiment.

Referring to FIG. 1A, the semiconductor device 10 includes a plurality of nitride semiconductor layers on a substrate 11. In FIG. 1A, the plurality of nitride semiconductor layers include a first nitride semiconductor layer 12, a second nitride semiconductor layer 14, and a third nitride semiconductor layer 16. At least one masking layer 13 is disposed between plurality of nitride semiconductor layers, and least one inter layer 15 is disposed between the plurality of nitride semiconductor layers above the masking layer 13. For example, the at least one masking layer 13 may be disposed between a first pair of the plurality of nitride semiconductor layers and the at least one inter layer 15 may be disposed between a second pair of the plurality of nitride semiconductor layers.

According to at least this example embodiment, the inter layer 15 may compensate for residual tensile stress induced by growth of the second nitride semiconductor layer 14 on the masking layer 13.

In more detail with regard to the example embodiment shown in FIG. 1A, the first nitride semiconductor layer 12 is disposed on the substrate 11, the masking layer 13 is formed on the first nitride semiconductor layer 12, the second nitride semiconductor layer 14 is formed on the masking layer 13, the inter layer 15 is formed on the second nitride semiconductor layer 14, and the third semiconductor layer 16 is formed on the inter layer 15.

According to at least some example embodiments, the substrate 11 may be removed during or after manufacturing the semiconductor device 10.

Figure 1B:
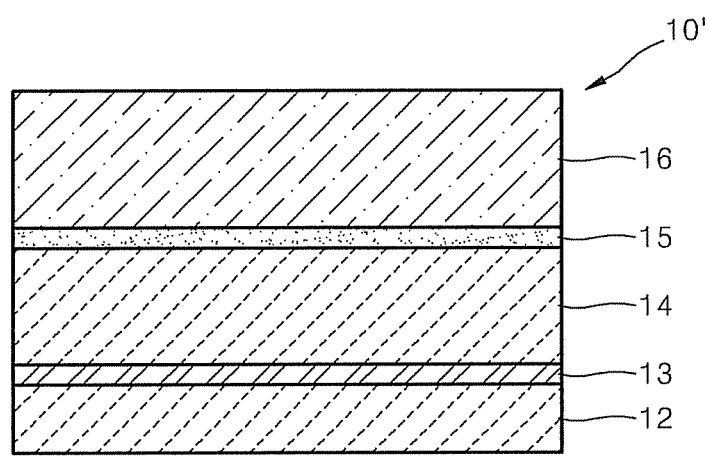
FIG. 1B is a cross-sectional view of a semiconductor device according to another example embodiment.

FIG. 1B is a cross-sectional view of an example embodiment of a semiconductor device 10' without the substrate 11.

In the semiconductor device 10', the masking layer 13 is formed on the first nitride semiconductor layer 12, the second nitride semiconductor layer 14 is formed on the masking layer 13, the inter layer 15 is formed on the second nitride semiconductor layer 14 and the third nitride semiconductor layer 16 is formed on the inter layer 15. As mentioned above, the semiconductor device 10' differs from the semiconductor device shown in FIG. 1A in that the semiconductor device 10' does not include the substrate 11.

Figure 2A:
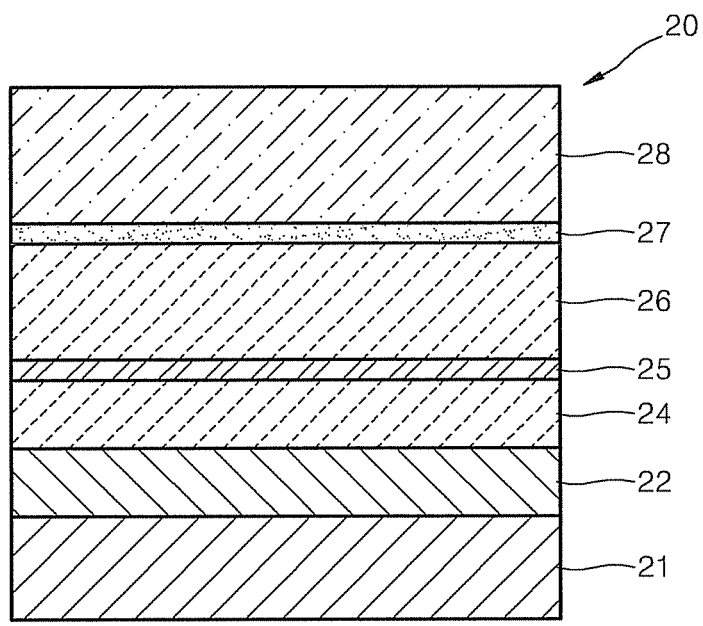
FIG. 2A is a cross-sectional view of a semiconductor device according to yet another example embodiment.
Figure 2B:
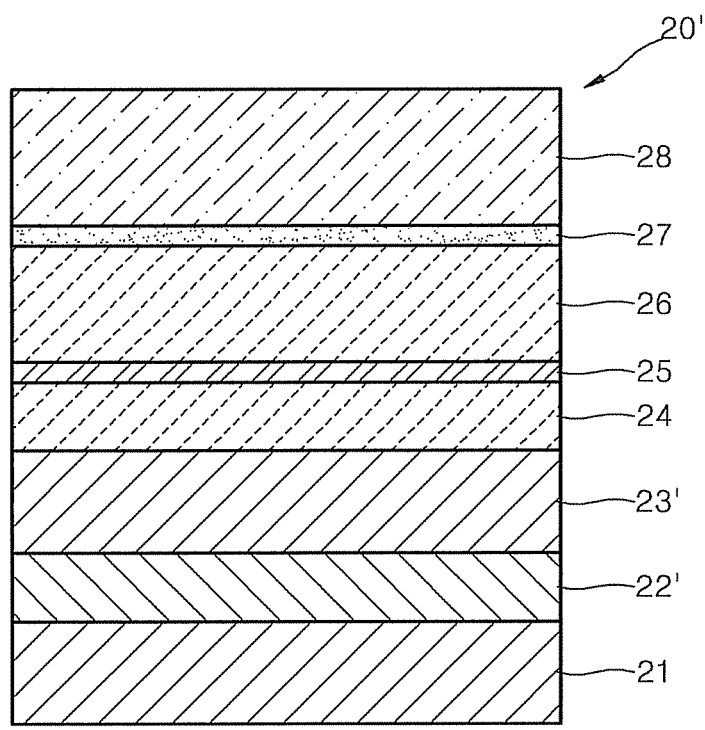
FIG. 2B is a cross-sectional view of a semiconductor device according to still another example embodiment.

FIGS. 2A and 2B are cross-sectional views of semiconductor devices according to other example embodiments. The semiconductor devices 20 and 20' shown in FIGS. 2A and 2B, respectively, include at least one buffer layer disposed on a substrate 21.

The example embodiment shown in FIG. 2A includes one buffer layer 22, whereas the example embodiment shown in FIG. 2B includes two buffer layers 22' and 23'.

According to at least some example embodiments, the buffer layers may be formed of a material including: aluminum-nitride (AlN), aluminum-gallium-nitride (AlGaN), step-graded aluminum-indium-gallium-nitride superlattice, such as step-graded $Al_xIn_yGa_{1-x-y}N$ ($0 \le x \le 1$, $0 \le y \le 1$, $x+y \le 1$), $Al_{x1}In_{y1}Ga_{1-x1-y1}N/Al_{x2}In_{y2}Ga_{1-x2-y2}N$ ($0 \le x1 \le 1$, $0 \le x2 \le 1$, $0 \le y1 \le 1$, $0 \le y2 \le 1$, $x1 \ne x2$ or $y1 \ne y2$, $x1+y1 \le 1$, $x2+y2 \le 1$) superlattice, a combination thereof, or the like.

According to at least some example embodiments, a plurality of nitride semiconductor layers may be disposed on the at least one buffer layer. At least one masking layer and at least one inter layer may be separately disposed between the plurality of nitride semiconductor layers. For example, the at least one masking layer may be disposed between a first pair of the plurality of nitride semiconductor layers and the at least one inter layer may be disposed between a second pair of the plurality of nitride semiconductor layers.

With regard to FIGS. 2A and 2B, a first nitride semiconductor layer 24 is disposed on at least one buffer layer (e.g., the first and second buffer layers 22' and 23' or the buffer layer 22), and a masking layer 25 is disposed on the first nitride semiconductor layer 24. A second nitride semiconductor layer 26 is disposed on the masking layer 25, and an inter layer 27 is disposed on the second nitride semiconductor layer 26. A third nitride semiconductor layer 28 is disposed on the inter layer 27.

Referring in more detail to FIG. 2A, a buffer layer 22 is formed on the substrate 21, and the first nitride semiconductor layer 24 is formed on the buffer layer 22. The masking layer 25 is formed on the first nitride semiconductor layer 24, and the second nitride semiconductor layer 26 is formed on the masking layer 25. The inter layer 27 is formed on the second nitride semiconductor layer 26, and the third nitride semiconductor layer 28 is formed on the inter layer 27.

Referring in more detail to FIG. 2B, in the semiconductor device 20', a first buffer layer 22' and a second buffer layer 23' are stacked sequentially on the substrate 21. The first nitride semiconductor layer 24 is formed on the second buffer layer 23', and the masking layer 25 is formed on the first nitride semiconductor layer 24. The second nitride semiconductor layer 26 is formed on the masking layer 25, and the inter layer 27 is formed on the second nitride semiconductor layer 26. The third nitride semiconductor layer 28 is formed on the inter layer 27.

The buffer layers 22, 22', and 23' shown in FIGS. 2A and 2B may reduce the number of dislocations caused by a difference between a lattice constant of the substrate 21 and a lattice constant of the first nitride semiconductor layer 24. The buffer layers 22, 22' and 23' may also suppress and/or prevent crack formations caused by a difference in thermal expansion coefficients of the substrate 21 and the first nitride semiconductor layer 24.

In the example embodiment shown in FIG. 2B, the first buffer layer 22' may also serve as a nucleation-growth layer. In one example, the first buffer layer 22' acting as the nucleation-growth layer may be formed of aluminum-nitride (AlN). According to at least some example embodiments, the nucleation-growth layer may suppress and/or prevent meltback, which may occur due to a reaction between the substrate 21 and the first nitride semiconductor layer 24. The first buffer layer 22' may allow the layer grown on the first buffer layer 22' (e.g., the second buffer layer 23' or the first nitride semiconductor layer 24) to be wet more easily. At an initial stage of growth of the nucleation-growth layer, an aluminum (Al) source is provided to suppress and/or prevent the substrate 21 from being exposed to nitrogen and being nitrified. In one example, the nucleation-growth layer may have a size of tens to hundreds of nanometers.

In the semiconductor device 20' shown in FIG. 2B, a dislocation loop may be formed at an interface between the second buffer layer 23' and the first nitride semiconductor layer 24 to reduce a dislocation density. When the second buffer layer 23' is formed of $Al_xGa_{1-x}N$ ($0 \leq x \leq 1$), the concentration of aluminum (Al) may be fixed or gradually reduced. For example, the concentration of Al may be reduced in a step-grade manner such as $Al_{0.7}Ga_{0.3}N \rightarrow Al_{0.5}Ga_{0.5}N \rightarrow Al_{0.3}Ga_{0.7}N$. In this case, a compressive stress may be generated during an epitaxial growing process because the lattice constant mismatch and the thermal expansion coefficient difference between the second buffer layer 23' and the first nitride semiconductor layer 24 is reduced (e.g., gradually reduced). This may reduce tensile stress generated during a cooling process. In addition, threading dislocations may be bent, which may further reduce dislocation density. As a thickness of the second buffer layer 23' is increased, compressive stress relaxation of the first nitride semiconductor layer 24 may be reduced, and a dislocation density may also be further reduced. The second buffer layer 23' may have a thickness of hundreds of nanometers to several micrometers.

According to at least some example embodiments, the substrate 21 may be removed during or after manufacturing a semiconductor device. In at least some other example embodiments, the one or more buffer layers (e.g., 22 in FIG. 2A, and 22' and 23' in FIG. 2B) may be removed along with the substrate 21. In stacked semiconductor structures according to at least some example embodiments, which will be discussed below, the removal of a substrate and a buffer layer is also possible, but its detailed explanation will be omitted here.

Still referring to FIGS. 1A through 2B, according to at least some example embodiments, the substrates 11 and 21 may be formed of a material including silicon. Thus, the substrates 11 and 21 may be silicon-based substrates. For example, the substrates 11 and 21 may be silicon (Si) substrates or silicon carbide (SiC) substrates. The silicon substrates may use a (111) face. The substrates 11 and 21 may be cleaned using sulfuric acid-hydrogen peroxide, hydrofluoric acid, deionized water, or the like. Impurities such as metals and organic materials and/or native oxide films may be removed from the surfaces of the substrates 11 and 21, which may have hydrogen-terminations and provide suitable surface condition for epitaxial growth.

The plurality of nitride semiconductor layers grown on the substrates 11 and 21 may be formed of, for example, a nitride including gallium. In one example, the plurality of nitride semiconductor layers may be formed of $Al_xIn_yGa_{1-x-y}N$ ($0 \leq x \leq 1$, $0 \leq y \leq 1$, $x+y<1$). For example, the plurality of nitride semiconductor layers may be formed of a material including any one of gallium-nitride (GaN), indium-gallium-nitride (InGaN), and aluminum-indium-gallium-nitride (AlInGaN). Alternatively, the plurality of nitride semiconductor layers may be formed of a nitride material that does not include aluminum (an aluminum-free nitride material).

The masking layers 13 and 25 may be formed of, for example, a silicon nitride ($SiN_x$) or a titanium nitride (TiN). In one example, a $SiN_x$ masking layer may be formed using $SiH_4$ (silane) and ammonia gas. The masking layers 13 and 25 may be formed randomly on the first nitride semiconductor layers 12 and 24, and may partially cover the surface areas of the first nitride semiconductor layers 12 and 24. Accordingly, portions of the first nitride semiconductor layers 12 and 24 may be exposed. The size and/or amount of the exposed portions of the first nitride semiconductor layers 12 and 24 may be determined by the coverage of the masking layers 13 and 25.

Initial portions (e.g., dots or islands) of the second nitride semiconductor layers 14 and 26 may be grown on the masking layers 13 and 25, and the growing characteristics (e.g., size and distribution) of the initial portion may be varied by the size of the portions covered by the masking layers 13 and 25. For example, when the area of a $SiN_x$ masking layer is increased, the area of exposed portions of a nitride semiconductor layer is reduced, and an initial density of the portion of the nitride semiconductor layer grown on the $SiN_x$ masking layer is reduced. However, a size of coalesced portions is increased, and a thickness of coalesced nitride semiconductor layer may increase as well.

The masking layers 13 and 25 shown in FIGS. 1A through 2B may reduce a dislocation density because the masking layers 13 and 25 mask (e.g., directly mask) a threading dislocation or because a threading dislocation is bent through facets of the portions of the second nitride semiconductor layers 14 and 26. A coalescence thickness and a dislocation density of the second nitride semiconductor layers 14 and 26 may be varied and may depend on growth conditions such as temperature, pressure, a V/III source ratio, etc. The conditions for growing a $SiN_x$ masking layer and a second nitride semiconductor layer may be selected to maintain a density of surface pit caused by a threading dislocation less than or equal to about $5 \times 10^8$ cm$^{-2}$ when coalescence is completed and a flat surface is obtained.

The first nitride semiconductor layer 24 may be subject to compressive stress due to the relatively small lattice size of the second buffer layer 23'. As a thickness of the first nitride semiconductor layer 24 increases, this compressive stress may be relaxed relatively slowly. However, when the masking layers 13 and 25 are disposed between the first nitride semiconductor layers 12 and 24 and the second nitride semiconductor layers 14 and 26, a stress between the two nitride semiconductor layers may be decoupled and a compressive stress transmitted to the second nitride semiconductor layers 14 and 26 may be suppressed and/or blocked.

Still referring to FIGS. 1A through 2B, according to at least some example embodiments, formation of initial portions of the second nitride semiconductor layers 14 and 26 may result in generation of a tensile stress when the initial portions coalesce. Accordingly, the first nitride semiconductor layers 12 and 24 may be subjected to a relatively strong compressive stress due to the masking layers 13 and 25. On the other hand, the second nitride semiconductor layers 14 and 26 may be subjected to a relatively weak compressive stress and/or tensile stress induced by stress decoupling and/or coalescence of the initial portions (e.g., dots or islands).

When the second nitride semiconductor layers 14 and 26 are subjected to a relatively weak compressive and/or tensile stress, cracks may form during a cooling process when the thickness of the second nitride semiconductor layers 14 and 26 exceeds a critical thickness. Accordingly, as island growth increases and a thickness of the second nitride semiconductor layers 14 and 26 increases, the probability of crack formation may increase. Therefore, a thickness of the second nitride semiconductor layers 14 and 26 at which crack formation is suppressed (e.g., does not occur) and a dislocation density is suppressed (e.g., minimized) may be determined.

According to at least some example embodiments, a dislocation density may be reduced and/or crack formation may be suppressed and/or prevented by reducing a coalescence thickness of the second nitride semiconductor layers 14 and 26 while maintaining a thickness of the masking layers 13 and 25. The coalescence thickness of the second nitride semiconductor layers 14 and 26 may be reduced by adjusting growing conditions, for example, by increasing a growth temperature, reducing a growth pressure, and/or increasing a V/III source ratio to enhance horizontal growth.

Although the growth conditions of the second nitride semiconductor layer are controlled relatively well in accordance with example embodiments, crack formation may occur when the second nitride semiconductor layers 14 and 26 are grown to a thickness greater than or equal to about 2 μm. In one example, during a cooling process down to the room temperature, tensile stress may be generated due to a difference in thermal expansion coefficients of the substrates 11 and 21 and the thermal expansion coefficient of the second nitride semiconductor layers 14 and 26. This tensile stress may induce cracks. According to at least some example embodiments, at least one inter layer 15 and 27 may be disposed on the second nitride semiconductor layers 14 and 26 to compensate for the above-described tensile stress. When third nitride semiconductor layers 16 and 28 are formed on the inter layers 15 and 27, the third nitride semiconductor layers 16 and 28 may have a relatively high compressive stress. This relatively high compressive stress may compensate for a relatively weak compressive stress and/or tensile stress, which may exist in the second nitride semiconductor layers 14 and 26. As a result, crack formation may be suppressed.

A plurality of nitride semiconductor layers may be selectively doped or undoped. An uppermost nitride semiconductor layer from among the plurality of nitride semiconductor layers may be doped with an n-type or p-type impurities, whereas the other nitride semiconductor layers may be undoped. Alternatively, a nitride semiconductor layer adjacent to the masking layer may be undoped. In the example embodiments shown in FIGS. 1A through 2B, the third nitride semiconductor layers 16 and 28 may be conductive nitride layers doped with n-type or p-type impurities. Alternatively, the third nitride semiconductor layers 16 and 28 may have a dual-layer structure including an undoped layer and a doped layer. In one example, the third nitride semiconductor layers 16 and 28 may have a thickness greater than or equal to about 2 μm and/or a doping concentration greater than or equal to about $3 \times 10^{18}$ cm$^{-3}$ considering a current spread of the semiconductor devices 10 and 20.

Figure 3A:
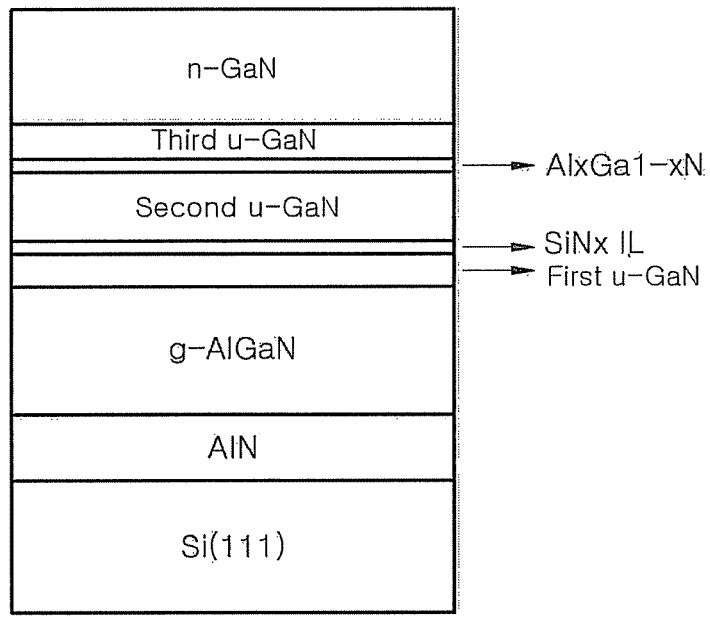
FIG. 3A is a conceptual cross-sectional view and a scanning electron microscope (SEM) image showing a stack of layers including a masking layer and an inter layer.
Figure 3A:
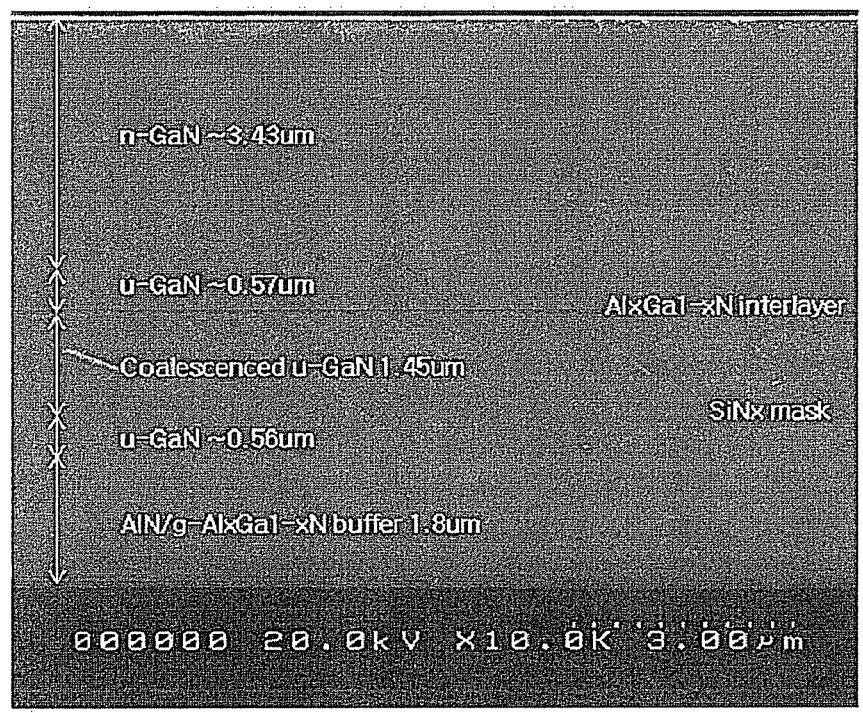
Figure 3B:
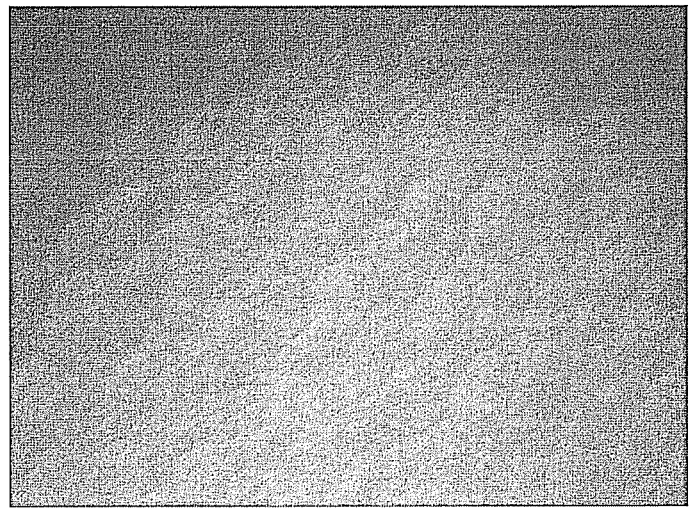
FIG. 3B is an optical microscope (OM) image of the stack of FIG. 3A.

FIG. 3A shows an example conceptual cross-sectional view and a scanning electron microscope (SEM) image of a stacked structure according to an example embodiment. In more detail, FIG. 3A illustrates an example of the semiconductor device 20 shown in FIG. 2B. FIG. 3B shows an optical microscope (OM) image of a top surface of the stacked structure.

Referring to FIG. 3A, an AlN nucleation growth layer is formed on a Si(111) substrate, and a g-AlGaN buffer layer is formed on the AlN nucleation growth layer. A first u-GaN semiconductor layer is formed on the g-AlGaN buffer layer. A SiN$_x$ masking layer is disposed on the first u-GaN semiconductor layer, and a second u-GaN semiconductor layer is formed on the SiN$_x$ masking layer. In alternative example embodiments, the SiN$_x$ masking layer may be embedded within a u-GaN semiconductor layer, which includes the first and the second u-GaN semiconductor layers formed of the same or substantially the same material. An Al$_x$Ga$_{1-x}$N inter layer is disposed on the second u-GaN semiconductor layer, and a third u-GaN semiconductor layer is formed on the Al$_x$Ga$_{1-x}$N inter layer. An n-GaN layer is formed on the third u-GaN semiconductor layer.

As shown in the OM image of FIG. 3B, crack formation may not occur in the entire or substantially the entire structure during cooling even though a thickness of the third u-GaN semiconductor layer disposed on the Al$_x$Ga$_{1-x}$N inter layer is greater than about 0.4 μm, and the silicon (Si) substrate has a doping concentration of about $3 \times 10^{18}$ cm$^{-3}$. In addition, a measured dislocation density of the third u-GaN semiconductor layer is maintained at about $5.3 \times 10^8$ cm$^{-2}$, which is relatively low. This may be caused by reduction in a density of a threading dislocation reaching the Al$_x$Ga$_{1-x}$N inter layer due to the SiN$_x$ masking layer, which may delay a relaxation of a compressive stress induced by the Al$_x$Ga$_{1-x}$N inter layer. As a result, crack formation may be suppressed and/or prevented.

Crack formation may occur during a cooling process in a structure having only a SiN$_x$ masking layer disposed on the first u-GaN semiconductor layer. Due to the presence of the SiN$_x$ masking layer, a dislocation density may be reduced to about $3.1 \times 10^8$ cm$^{-2}$ when the second nitride semiconductor layer is formed of u-GaN and the third semiconductor layer is formed of n-GaN. However, tensile stress may be generated when n-doping of the Si substrate increases and additional tensile stress may be generated when islands on the masking layer coalesce, which may cause cracks to form during the cooling process.

Comparison experiments were conducted on a conventional structure having a SiN$_x$ masking layer disposed between an AlGaN buffer layer and a GaN layer and on the structure having the SiN$_x$ masking layer disposed within the GaN layer (as shown, e.g., in FIG. 3A). Except for the location of the SiN$_x$ masking layer, other structural characteristics (e.g., thickness and sequence of other layers) of the conventional structure and the structure according to example embodiments are substantially the same. The crystal qualities of both structures were examined, and the GaN in the conventional structure showed less desirable crystal quality than the GaN in the structure according to example embodiments.

For example, the full width at half maximum (FWHM) values in the x-ray diffraction (XRD) peak rocking curve of GaN (002)/(102) in the structure according to an example embodiment were about 324 arcsec and about 383 arcsec. On the other hand, the FWHM values in the XRD peak rocking curve of GaN (002)/(102) in the conventional structure having the SiN masking layer disposed directly on the AlGaN buffer layer were about 380 arcsec and about 400 arcsec.

In a structure having only an Al$_x$Ga$_{1-x}$N inter layer (without a masking layer), where the inter layer is disposed between a u-GaN nitride semiconductor layer and a n-GaN semiconductor layer, a dislocation density is relatively high (e.g., about $7.7 \times 10^8$ cm$^{-2}$). The relatively high dislocation density may result from omission of the masking layer to reduce a dislocation density. However, crack formation may not occur in a surface of a thin film due to a compressive stress applied by the inter layer.

According to at least some example embodiments, an AlN nucleation growth layer and a step-graded Al$_x$Ga$_{1-x}$N(g-Al$_x$Ga$_{1-x}$N) buffer layer are included in a stacked semiconductor structure.

According to the conventional art, an OM image (not shown) of a structure including only an inter layer, but without a masking layer, does not show cracks on an outer surface, but does show hatch shaped inner cracks inside of the thin film. Such inner cracks are not observed in FIG. 3B. Therefore, the stress compensation effect of the $Al_xGa_{1-x}N$ inter layer may be improved by reducing a threading dislocation density with the $SiN_x$ masking layer, which may also reduce a tensile stress level and/or a dislocation density.

When the $SiN_x$ masking layer is formed on a buffer layer or on a nucleation growth layer including aluminum, a dislocation density may be reduced. A dislocation density may be further reduced by forming the $SiN_x$ masking layer on a first nitride semiconductor layer as shown in at least some example embodiments.

The effect of dislocation bending generated between the buffer layer and a nitride semiconductor layer may not be utilized when a $SiN_x$ masking layer is disposed on a buffer layer. As a result, reducing a dislocation density down to a desired level before forming an inter layer may be relatively difficult. In this case, applying the inter layer may not provide a sufficient stress compensation effect. Accordingly, a plurality of inter layers may be included to obtain a sufficient stress compensation. However, the use of the plurality of inter layers may regenerate dislocations and/or degrade crystal quality. Therefore, the dislocation density reduced as a result of the masking layer may again increase. At least some example embodiments may include a final masking layer to counter this effect. However, the final masking layer may limit a thickness of a nitride semiconductor layer grown on the final masking layer. Thus, a doping concentration and/or a thickness of an n-type conductive nitride semiconductor layer may be reduced. Therefore, when the masking layer is disposed on the buffer layer, the use of the masking layer and the inter layer may not provide sufficient dislocation density reduction and/or compensation effect for a tensile stress.

A substrate, a buffer layer, and a nitride semiconductor layer discussed in connection with at least some example embodiments are the same or substantially the same as those discussed above with regard to the semiconductor devices shown in FIGS. 1A, 1B, 2A, and 2B. Therefore, detailed explanations of these elements will be omitted when discussing the following example embodiments.

Figure 4:
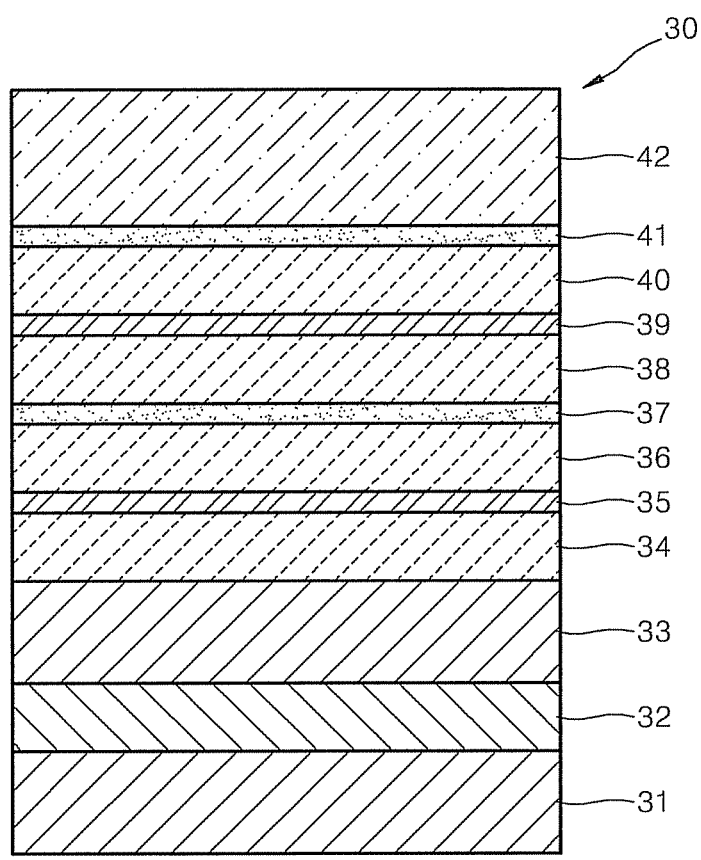
FIG. 4 is a cross-sectional view of a semiconductor device according to another example embodiment.

FIG. 4 is a cross-sectional view of a semiconductor device 30 according to another example embodiment.

Referring to FIG. 4, the semiconductor device 30 includes a first buffer layer 32 and a second buffer layer 33 disposed on a substrate 31. A plurality of nitride semiconductor layers disposed on the second buffer layer 33. The plurality of nitride semiconductor layers include first through fifth nitride semiconductor layers 34, 36, 38, 40, and 42. One or more pairs of a masking layer and an inter layer are arranged alternately between the plurality of nitride semiconductor layers.

In more detail with regard to the semiconductor device 30 shown in FIG. 4, the first buffer layer 32 is disposed on the substrate 31, and the second buffer layer 33 is disposed on the first buffer layer 32. The first nitride semiconductor layer 34 is disposed on the second buffer layer 33, and a first masking layer 35 is disposed on the first nitride semiconductor layer 34. The second nitride semiconductor layer 36 is disposed on the first masking layer 35, and a first inter layer 37 is disposed on the second nitride semiconductor layer 36. The third nitride semiconductor layer 38 is disposed on the first inter layer 37, and a second masking layer 39 is disposed on the third nitride semiconductor layer 38. The fourth nitride semiconductor layer 40 is disposed on the second masking layer 39, and a second inter layer 41 is disposed on the fourth nitride semiconductor layer 40. The fifth nitride semiconductor layer 42 is disposed on the second inter layer 41.

As shown in FIG. 4, the first masking layer 35 is disposed between the first nitride semiconductor layer 34 and the second nitride semiconductor layer 36. The first inter layer 37 is disposed between the second nitride semiconductor layer 36 and the third nitride semiconductor layer 38. The second masking layer 39 is disposed between the third nitride semiconductor layer 38 and the fourth nitride semiconductor layer 40. The second inter layer 41 is disposed between the fourth nitride semiconductor layer 40 and the fifth nitride semiconductor layer 42.

In FIG. 4, the first masking layer 35 and the first inter layer 37 constitute a first pair, and the second masking layer 39 and the second inter layer 41 constitute a second pair.

Moreover, the first nitride semiconductor layer 34 and the first masking layer 35 may be referred to as a first stack structure, the second nitride semiconductor layer 36 and the first inter layer 37 may be considered a second stack structure, the third nitride semiconductor layer 38 and the second masking layer 39 may be considered and third stack structure, and so on.

Alternatively, the first nitride semiconductor layer 34, the first masking layer 35, the second nitride semiconductor layer 36 and the first inter layer 37 may be considered a first stack structure, while the third nitride semiconductor layer 38, the second masking layer 39, the fourth nitride semiconductor layer 40 and the second inter layer 41 may be considered a second stack structure.

When a pair including a $SiN_x$ masking layer and an $Al_xGa_{1-x}N$ inter layer is stacked more than once (e.g., twice) as shown in FIG. 4, masking effects may be doubled. As a result, a dislocation density may be further reduced and/or crystal quality may be improved. For example, a dislocation density may be reduced to less than or equal to about $3 \times 10^8$ cm$^{-2}$, and, full widths at half maximum values of GaN 002 and 102 XRD peaks may be less than or equal to about 230 arcsec and about 310 arcsec, respectively. When the $SiN_x$ masking layer and the $Al_xGa_{1-x}N$ inter layer are stacked repeatedly, a dislocation density within a nitride semiconductor layer may be further reduced, and thus, a nitride semiconductor layer with a relatively low dislocation density may be obtained.

The semiconductor device 30 shown in FIG. 4 includes first and second buffer layers 32 and 33. However, according to at least some other example embodiments, the semiconductor device 30 may include one of buffer layers 32 and 33 or more than two buffer layers.

Figure 5:
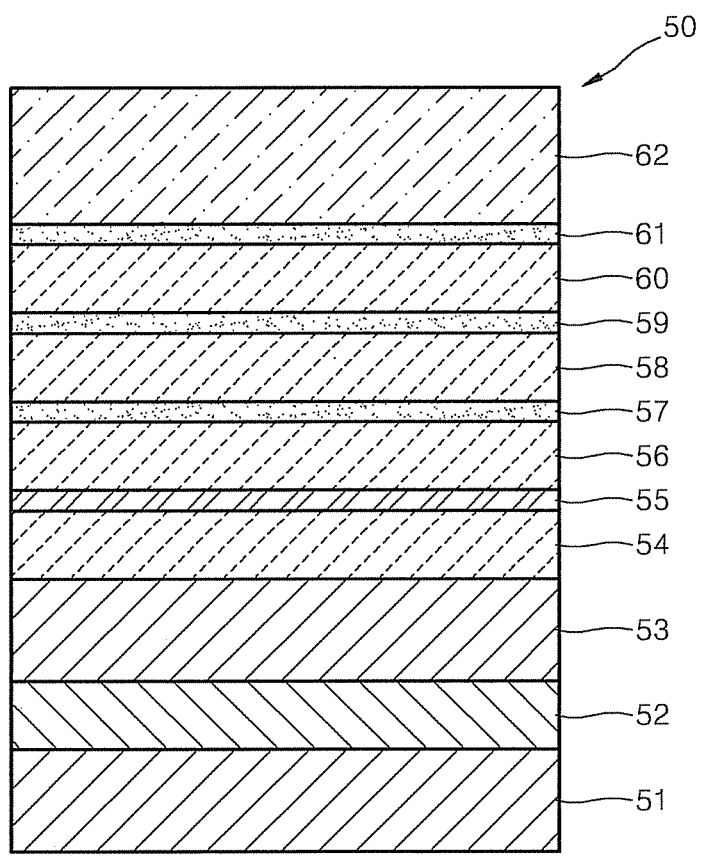
FIG. 5 is a cross-sectional view of a semiconductor device according to yet another example embodiment.

FIG. 5 is a cross-sectional view of a semiconductor device 50 according to another example embodiment.

Referring to FIG. 5, a first buffer layer 52 and a second buffer layer 53 are disposed sequentially on a substrate 51. A first nitride semiconductor layer 54 is disposed on the second buffer layer 53, and a masking layer 55 is disposed on the first nitride semiconductor layer 54. A second nitride semiconductor layer 56 is disposed on the masking layer 55, and a first inter layer 57 is disposed on the second nitride semiconductor layer 56. A third nitride semiconductor layer 58 is disposed on the first inter layer 57 and a second inter layer 59 is disposed on the third nitride semiconductor layer 58. A fourth nitride semiconductor layer 60 is disposed on the second inter layer 59, and a third inter layer 61 is disposed on the fourth nitride semiconductor layer 60. A fifth nitride semiconductor layer 62 is disposed on the third inter layer 61.

As shown in FIG. 5, a plurality of inter layers are disposed between adjacent nitride semiconductor layers above the masking layer 55. In FIG. 5, the plurality of inter layers include first through third inter layers 57, 59, and 61. However, example embodiments may include more than three inter layers.

According to at least some example embodiments, the first and second buffer layers 52 and 53 in FIG. 5 are optional, and may include a nucleation-growth layer. Moreover, although the semiconductor device 50 includes two buffer layers 52 and 53, according to at least some example embodiments, the semiconductor device 50 may include a single buffer layer, or more than two buffer layers.

The example embodiment shown in FIG. 5 includes a masking layer, a first inter layer, and at least one additional inter layer disposed above the first inter layer.

Figure 6A:
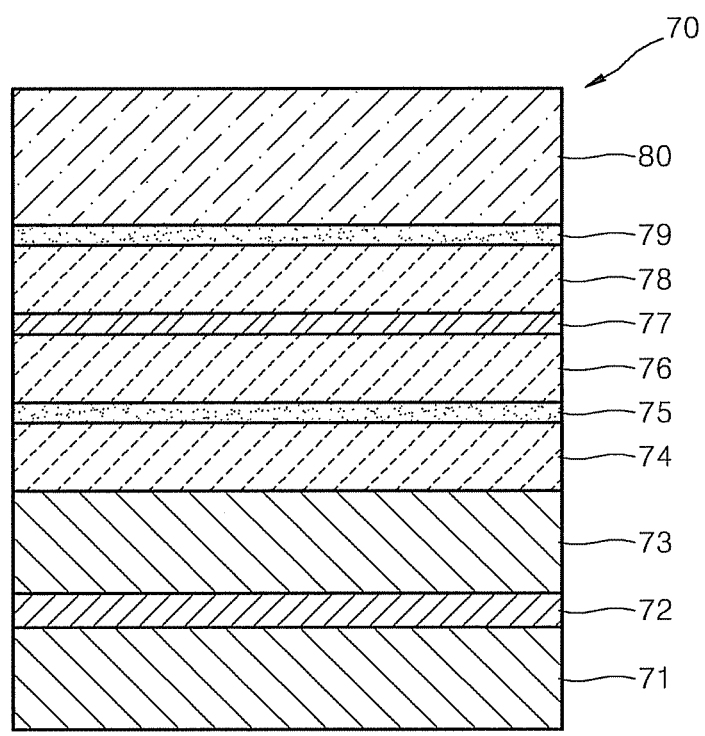
FIGS. 6A and 6B are cross-sectional views of semiconductor devices according to other example embodiments.
Figure 6B:
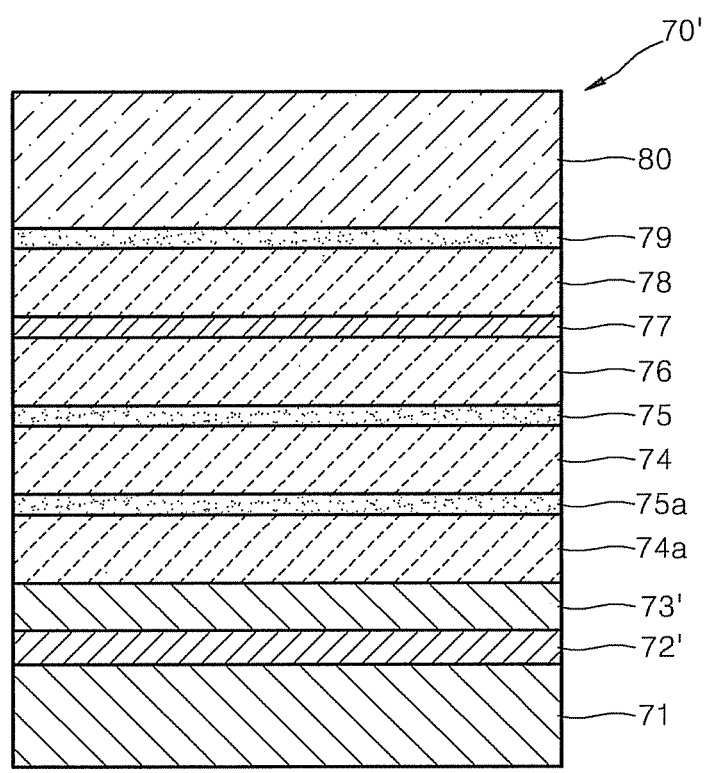

FIGS. 6A and 6B are cross-sectional views of semiconductor devices according to other example embodiments. In the example embodiments shown in FIGS. 6A and 6B, at least one inter layer is disposed between two nitride semiconductor layers below a masking layer 77. Although only one inter layer is disposed under the masking layer 77 in FIG. 6A, example embodiments may include a plurality of inter layers under the masking layer 77.

Referring in more detail to FIG. 6A, the semiconductor device 70 includes a first buffer layer 72 and a second buffer layer 73 disposed sequentially on a substrate 71. A first nitride semiconductor layer 74 is disposed on the second buffer layer 73. A first inter layer 75 is disposed on the first nitride semiconductor layer 74, and a second nitride semiconductor layer 76 is disposed on the first inter layer 75. A masking layer 77 is disposed on the second nitride semiconductor layer 76, and a third nitride semiconductor layer 78 is disposed on the masking layer 77. A second inter layer 79 is disposed on the third nitride semiconductor layer 78, and a fourth nitride semiconductor layer 80 is disposed on the second inter layer 79.

In the example embodiment shown in FIG. 6A, the second nitride semiconductor layer 76, the masking layer 77, the third nitride semiconductor layer 78, the second inter layer 79, and the fourth nitride semiconductor layer 80 are sequentially disposed on the first inter layer 75.

Referring to FIG. 6B, the semiconductor device 70' includes a first buffer layer 72' and a second buffer layer 73' disposed sequentially on the substrate 71. A fifth nitride semiconductor layer 74a is disposed on the second buffer layer 73', and a third inter layer 75a is disposed on the fifth nitride semiconductor layer 74a. The first nitride semiconductor layer 74 is disposed on the third inter layer 75a, and the first inter layer 75 is disposed on the first nitride semiconductor layer 74. The second nitride semiconductor layer 76 is disposed on the first inter layer 75, and a masking layer 77 is disposed on the second nitride semiconductor layer 76. The third nitride semiconductor layer 78 is disposed on the masking layer 77, and the second inter layer 79 is disposed on the third nitride semiconductor layer 78. The fourth nitride semiconductor layer 80 is disposed on the second inter layer 79.

The semiconductor device 70' shown in FIG. 6B is similar to the semiconductor device 70 shown in FIG. 6A, except that the fifth nitride semiconductor layer 74a and the third inter layer 75a are disposed below the first nitride semiconductor layer 74. In the example embodiments shown in FIGS. 6A and 6B, at least one inter layer is disposed under a masking layer.

Providing one or more inter layers below the masking layer 77 may increase compressive stress. Thus, the inter layer placed below the masking layer 77 may substitute (e.g., partially or completely) for one or more of the buffer layers 72' and 73'. The use of the one or more buffer layers 72' and 73' is optional. For example, when at least one inter layer is disposed below the masking layer 77, a thickness of an AlGaN buffer layer (e.g., buffer layer 73') may be reduced. The thickness reduction of the AlGaN buffer layer may reduce the growth time for the buffer layer because the growth rate of the AlGaN is relatively slow. Therefore, the process/fabrication time of such a semiconductor device may be reduced by including at least one inter layer under the masking layer 77. In other words, throughput may be improved by substituting one or more of the buffer layers 72, 73, 72' and 73' with one or more inter layers 75 and 75a because the buffer layers may contain a material (e.g., aluminum) having a relatively low growth rate. In addition, the presence of the one or more inter layers below the masking layer may improve crystal quality of the resultant semiconductor devices.

Figure 7:
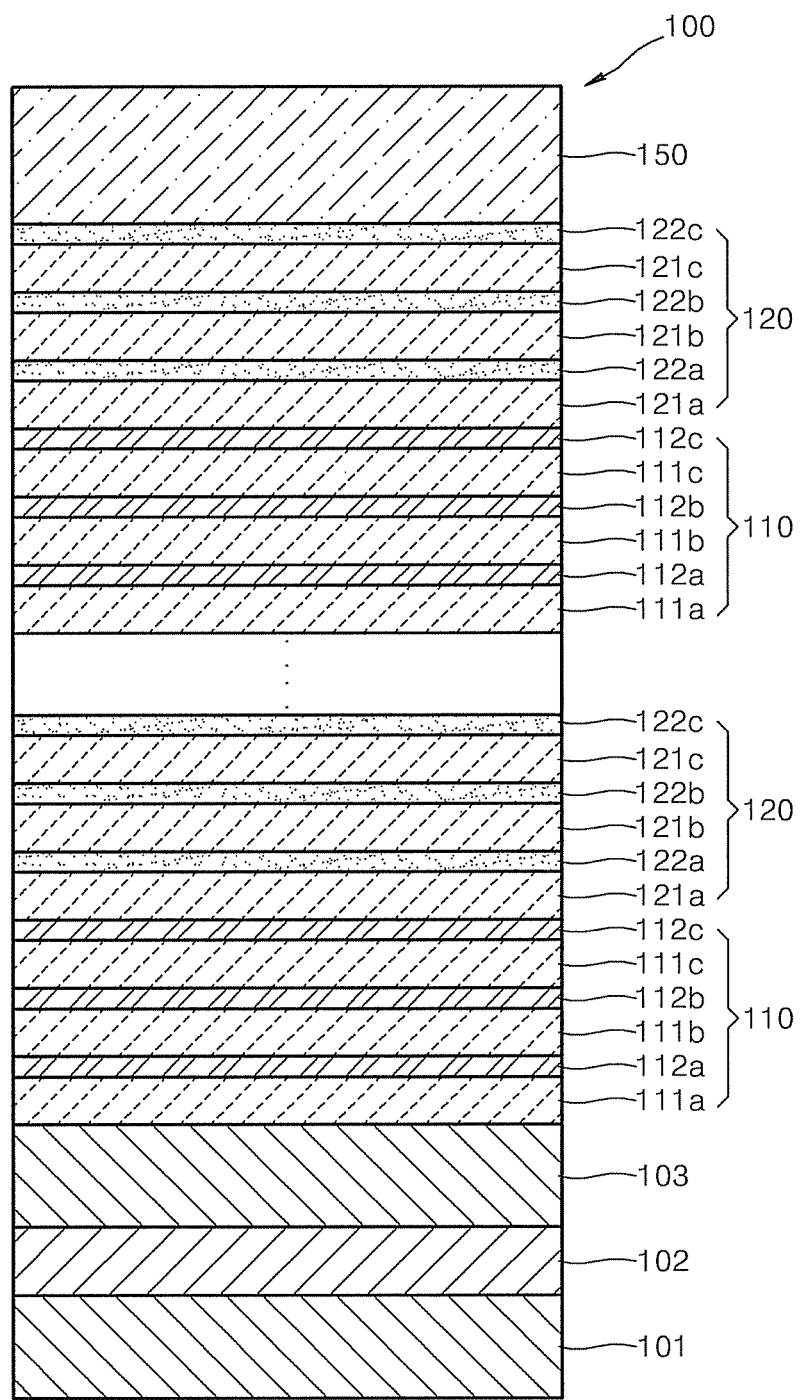
FIG. 7 is a cross-sectional view of a semiconductor device according to still another example embodiment.

FIG. 7 is a cross-sectional view of a semiconductor device 100 according to still another example embodiment.

Referring to FIG. 7, the semiconductor device 100 includes a plurality of stack structures formed on a substrate 101. Each of the plurality of stack structures includes a plurality of nitride semiconductor layers and one of a plurality of masking layers and a plurality of inter layers disposed between the plurality of nitride semiconductor layers.

In more detail with regard to FIG. 7, the semiconductor device 100 includes a first buffer layer 102 and a second buffer layer 103 disposed on a substrate 101. A first stack structure (also referred to as a first region) 110 includes a plurality of nitride semiconductor layers and a plurality of masking layers disposed between the plurality of nitride semiconductor layers.

More specifically, the first stack structure 110 includes a first nitride semiconductor layer 111a, a first masking layer 112a disposed on the semiconductor layer 111a, a second nitride semiconductor layer 111b disposed on the first masking layer 112a, a second masking layer 112b disposed on the second nitride semiconductor layer 111b, a third nitride semiconductor layer 111c disposed on the second masking layer 112b, and a third masking layer 112c disposed on the third nitride semiconductor layer 111c.

A second stack structure (also referred to as a second region) 120 of the semiconductor device 100 also includes a plurality nitride semiconductor layers and a plurality of inter layers disposed between the plurality of nitride semiconductor layers.

More specifically, the second stack structure 120 includes a fourth nitride semiconductor layer 121a, a first inter layer 122a disposed on the fourth nitride semiconductor layer 121a, a fifth nitride semiconductor layer 121b disposed on the first inter layer 122a, a second inter layer 122b disposed on the fifth nitride semiconductor layer 121b, a sixth nitride semiconductor layer 121c disposed on the second inter layer 122b, and a third inter layer 122c disposed on the sixth nitride semiconductor layer 121c.

As also shown in FIG. 7, a plurality of the first and second stack structures 110 and 120 are stacked alternately.

According to at least some example embodiments, the semiconductor device 100 may include one or more first and second stack structures 110 and 120.

Moreover, example embodiments are not limited only three masking layers in the first stack structure 110 and/or only three inter layers in the second stack structure 120 as shown in FIG. 7. Rather, the first stack structure 110 may include two or more masking layers and the second stack structure 120 may include two or more inter layers.

In another alternative, the first stack structure 110 may include one or more masking layers and the second stack structure may include a different number of inter layers, for example, two or more inter layers.

Still referring to FIG. 7, a final (seventh) nitride semiconductor layer 150 is disposed on the uppermost second stack structure 120. The seventh nitride semiconductor layer 150 may be a doped n-type or p-type layer. Alternatively, the seventh nitride semiconductor layer 150 may have a multi-layer structure including at least one undoped layer and at least one doped layer.

According to at least some example embodiments, compressive stress relaxation in the inter layer may be reduced and/or prevented by adjusting the composition of an inter layer while maintaining a relatively low dislocation density reduced by a masking layer. This will be explained in more detail below with regard to the semiconductor device 20 illustrated in FIG. 2B.

Referring back to FIG. 2B, a relatively large lattice mismatch between the inter layer 27 and the third nitride semiconductor layer 28 exists in order for the inter layer 27 to apply a compressive stress to the third nitride semiconductor layer 28. In one example, if the third nitride semiconductor layer 28 is formed of a gallium nitride (GaN) and the inter layer 27 is formed of $Al_xGa_{1-x}N$, the inter layer 27 may have a thickness of between about 10 nm and 100 nm in order to have a relaxed lattice. When a thickness of the inter layer 27 is too small, the relaxation of the lattice of the inter layer 27 may not occur, and thus, a compressive stress due to a lattice mismatch may not be applied effectively to the third nitride semiconductor layer 28 grown on the inter layer 27. When a thickness of the inter layer 27 is too large, the inter layer 27 may be subjected to a tensile stress induced by the second nitride semiconductor layer 26 located under the inter layer 27, which may result in the occurrence of cracks. Meanwhile, compressive stress relaxation due to a lattice mismatch may be adjusted by controlling the concentration of aluminum (Al) in the inter layer 27. When excessive lattice mismatch occurs due to excessive Al in the inter layer 27, a dislocation may be generated to relax stress. In this case, the generated dislocations may be offset by the dislocation density reduction effect of the masking layer 25.

Figure 8A:
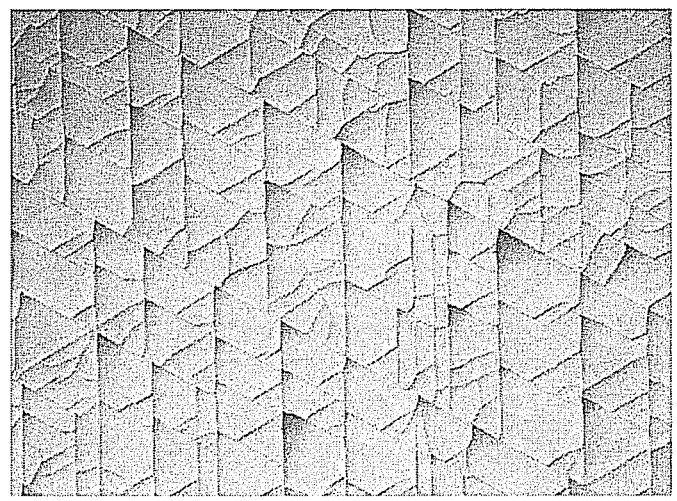
FIGS. 8A through 8C are example OM images illustrating cracks formed in a gallium nitride (GaN) semiconductor layer when a concentration of aluminum (Al) in an $Al_xGa_{1-x}N$ inter layer is changed.
Figure 8B:
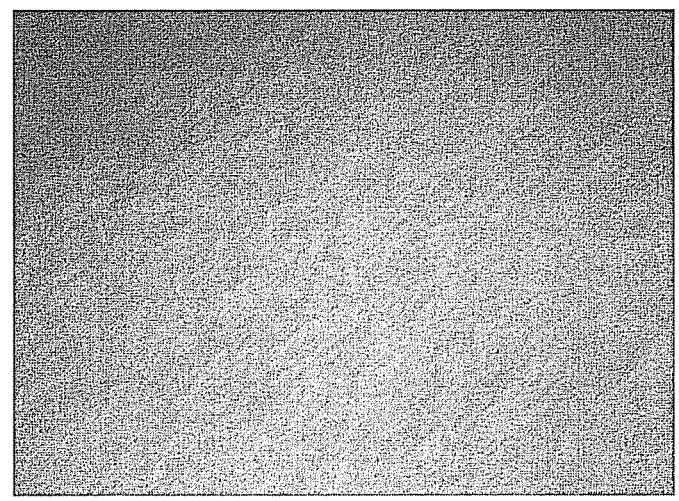
Figure 8C:
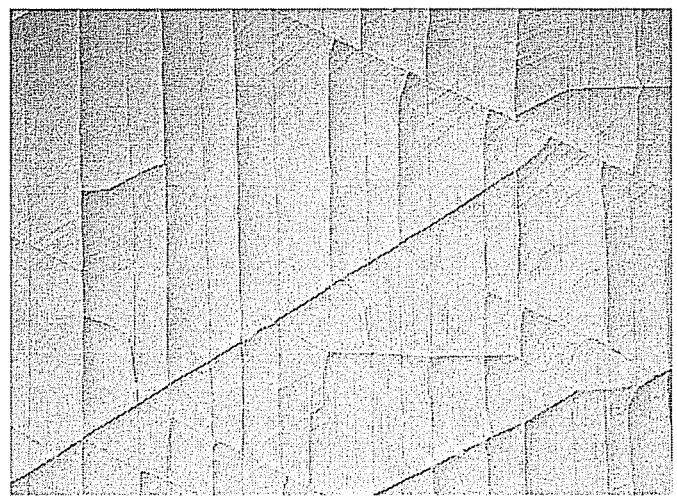

FIGS. 8A through 8C are example OM images illustrating example cracks formed in a GaN semiconductor layer when the concentration of aluminum (Al) in an $Al_xGa_{1-x}N$ inter layer is changed.

In FIG. 8A, an AlGaN inter layer has an Al concentration of about 40%. Because the AlGaN inter layer may be unable to apply a sufficient compressive stress, crack formation occurs as shown in FIG. 8A. The dislocation density is about $5\times10^{18}$ $cm^{-2}$, which is not substantially higher than a structure including only a masking layer.

In FIG. 8B, an AlGaN inter layer has an Al concentration of about 60%. And, crack formation did not occur even though the dislocation density remained at about $5\times10^{18}$ $cm^{-2}$.

In FIG. 8C, an AlN inter layer has an Al concentration of about 100%. The dislocation density is increased up to about the low $10^9$ $cm^{-2}$, and a compressive stress relaxation and crack formation occur.

Accordingly, there is an Al concentration at which stress compensation is sustained and dislocation generation is suppressed and/or prevented. In one example, the inter layer may be formed of $Al_xGa_{1-x}N$, where $0.4<x<1$, and the thickness of the $Al_xGa_{1-x}N$ inter layer may be between about 10 nm and about 100 nm, inclusive. Accordingly, for example, when a structure includes at least one buffer layer, a masking layer, a nitride semiconductor layer, and an $Al_xGa_{1-x}N$ inter layer $(0.4<x<1)$ disposed on a substrate, a dislocation density may be reduced by the masking layer and stress may be compensated by the $Al_xGa_{1-x}N$ inter layer.

According to at least some example embodiments, a masking layer is disposed on a nitride semiconductor layer in a semiconductor device. It is relatively difficult to transmit a threading dislocation of a first nitride semiconductor layer to a second nitride semiconductor layer. Thus, the inclusion of the masking layer may reduce a dislocation density and enable a compressive stress due to the inter layer to be more easily applied.

According to at least some example embodiments, a dislocation density at an interface between a buffer layer and a first nitride semiconductor layer may be reduced. The dislocation density may be further reduced by forming the masking layer on the first nitride semiconductor layer. Because a dislocation density is sufficiently reduced prior to formation of an inter layer, the effect of dislocation generated due to the use of the inter layer may be relatively minor, and thus, the dislocation density reduction effect introduced by the masking layer may be maintained or further enhanced. While a tensile stress is compensated by the inter layer, crack formation may be suppressed and/or prevented. In addition, dislocation generated by the inter layer may be reduced or removed by adjusting a thickness and/or a composition of the inter layer. Therefore, a nitride semiconductor layer having a relatively low dislocation density may be grown without cracks, even in a structure including only a single inter layer.

For example, the semiconductor device 20 illustrated in FIG. 2B may include a nitride semiconductor layer without cracks on the inter layer 27. Additionally, the nitride semiconductor layer may have a dislocation density less than or equal to about $4\times10^8$ $cm^{-2}$, a thickness greater than or equal to about 3.4 μm, and an n-doping concentration greater than or equal to about $4\times10^{18}$ $cm^{-3}$. A full width at half maximum values of GaN 002 and 102 XRD peaks may be less than or equal to about 280 arcsec and 350 arcsec, respectively.

According to at least some example embodiments, when a nitride semiconductor layer is grown on a silicon substrate or a silicon carbide substrate, the nitride semiconductor layer may be grown to a desired thickness by reducing a tensile stress and/or a lattice dislocation. The use of a silicon substrate or a silicon carbide substrate may allow fabrication of a wafer with a relatively large diameter. Semiconductor devices according to the at least some example embodiments may be employed for various electrical devices, such as light-emitting diodes, Schottky diodes, laser diodes, field effect transistors, power devices, and the like.

Figure 9:
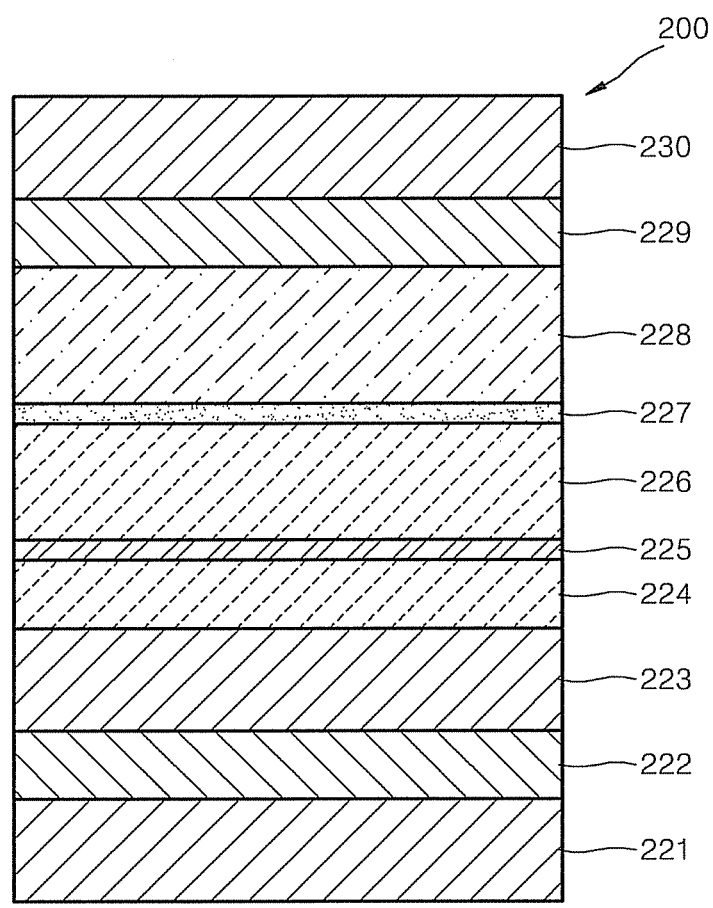
FIG. 9 is a cross-sectional view of a light emitting device including a semiconductor device according to an example embodiment.

FIG. 9 is a cross-sectional view of a light emitting device 200 including a semiconductor device according to an example embodiment.

Referring to FIG. 9, the light emitting device 200 includes a plurality of nitride semiconductor layers disposed on a substrate 221, at least one masking layer and at least one inter layer disposed between the plurality of nitride semiconductor layers. The inter layer is disposed above the masking layer.

In more detail, a first and second buffer layer 222 and 223 are disposed sequentially on the substrate 221. A first nitride semiconductor layer 224 is disposed on the second buffer layer 223, and a masking layer 225 is disposed on the first nitride semiconductor layer 224. A second nitride semiconductor layer 226 is disposed on the masking layer 225, and an inter layer 227 is disposed on the second nitride semiconductor layer 226. A third nitride semiconductor layer 228 is disposed on the inter layer 227. The third nitride semiconductor layer 228 may be doped with a first type (e.g., n-type) of impurities to be a first type layer (e.g., an n-type layer). The first nitride semiconductor layer 224 and the second nitride semiconductor layer 226 may be selectively doped or undoped.

Still referring to FIG. 9, an active layer 229 is disposed on the third nitride semiconductor layer 228, and a fourth nitride semiconductor layer 230 is disposed on the active layer 229. The fourth nitride semiconductor layer 230 may be doped with a second type (e.g., p-type) of impurities to be a second type layer (e.g., a p-type layer).

The example embodiment shown in FIG. 9 includes two buffer layers 222 and 223. However, at least some example embodiments may include one or more buffer layers between the substrate 221 and the first nitride semiconductor layer 224.

According to at least some example embodiments, the substrate 221 may be removed during or after manufacturing the semiconductor device 200. According to at least some other example embodiments, the substrate 221, the first buffer layer 222, and the second buffer layer 223 may be removed together.

Figure 10:
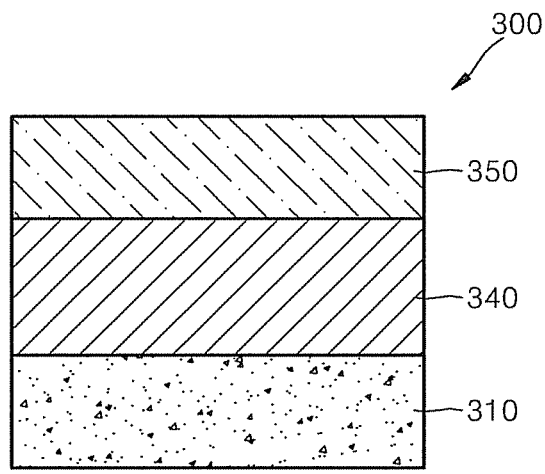
FIG. 10 is a schematic cross-sectional view of a semiconductor device according to an example embodiment.

FIG. 10 is a schematic cross-sectional view of a semiconductor device 300 according to another example embodiment.

Referring to FIG. 10, the semiconductor device 300 includes a silicon-based substrate 310, a buffer layer 340, and a nitride stack 350. The buffer layer 340 and the nitride stack 350 are sequentially disposed on the silicon-based substrate 310.

The silicon-based substrate 310 may be formed by doping a substrate with a relatively high concentration of p-type impurities. The silicon-based substrate 310 may be a silicon substrate, a silicon carbide substrate, or the like. The silicon-based substrate 310 may be, for example, a wafer doped with a relatively high concentration of p-type impurities. Alternatively, the silicon-based substrate 310 may be obtained from a wafer that is not doped with p-type impurities, or a wafer that is doped with a relatively low concentration of p-type impurities through a process such as implantation. The p-type impurities may be, for example, boron (B), aluminum (Al), magnesium (Mg), calcium (Ca), zinc (Zn), cadmium (Cd), mercury (Hg), gallium (Ga), or the like. A doping concentration may be greater than or equal to about $10^{17}$ cm$^{-3}$. However, the doping concentration may depend on the type of impurities being used. For example, when the p-type impurities are boron (B), the doping concentration may be in a range from about $5\times10^{17}$ cm$^{-3}$ to about $10^{20}$ cm$^{-3}$, inclusive, or from about $10^{18}$ cm$^{-3}$ to about $5\times10^{19}$ cm$^{-3}$, inclusive.

When the doping concentration is lower than about $5\times10^{17}$ cm$^{-3}$, it may be relatively difficult to reduce bow effects. On the other hand, when the doping concentration is higher than about $10^{20}$ cm$^{-3}$, it may be relatively difficult to form a single crystalline silicon substrate.

According to at least some example embodiments, the doping concentration may be determined such that a resistivity of the silicon-based substrate 310 remains less than or equal to about 1 Ωcm.

According to at least some example embodiments, the buffer layer 340 may help ensure a given, desired, or predetermined thin film quality of the nitride stack 350, which is grown on the silicon-based substrate 310. The buffer layer 340 may be formed from a material that is different from the nitride stack 350. The buffer layer 340 may reduce dislocations generated due to a difference in the lattice constant of the silicon-based substrate 310 and the lattice constant of the nitride stack 350. The buffer layer 340 may also suppress and/or prevent formation of cracks because of a difference between the thermal expansion coefficient of the silicon-based substrate 310 and the thermal expansion coefficient of the nitride stack 350.

According to at least some example embodiments, the buffer layer 340 may include at least one buffer layer and a nucleation-growth layer. The buffer layer 340 may have a single layer structure or a multi-layer structure formed of, for example, aluminum-nitride (AlN), silicon-carbide (SIC), alumina ($Al_2O_3$), aluminum-gallium-nitride (AlGaN), aluminum-indium-gallium-nitride (AlInGaN), aluminum-indium-boron-gallium-nitride (AlInBGaN), aluminum-boron-gallium-nitride (AlBGaN), gallium-nitride (GaN), a combination thereof or the like. Alternatively, the buffer layer 340 having a single or multi-layer structure formed of a material combination XY, where X is at least one of titanium (Ti), chromium (Cr), zirconium (Zr), hafnium (Hf), niobium (Nb), tantalum (Ta), or the like, and Y is at least one of nitrogen (N), boron (B, $B_2$), or the like.

The nitride stack 350 may include at least one GaN-based compound semiconductor layer. In one example, the nitride stack 350 may include a plurality of nitride semiconductor layers. At least one masking layer may be disposed between the plurality of nitride semiconductor layers, and at least one inter layer may be disposed between the plurality of nitride semiconductor layers. In one example, the nitride stack 350 may have a structure as shown in FIG. 1B. However, example embodiments are not limited thereto, and the nitride stack 350 may have any of various structures, including those discussed herein.

According to at least some example embodiments, the nitride semiconductor layers may include a clad layer. Alternatively, the nitride semiconductor layers may include an n-GaN layer doped with n-type impurities or a p-GaN layer doped with p-type impurities. In a further alternative example embodiment, the nitride semiconductor layers may include a u-GaN layer, which is not doped with impurities.

When the nitride semiconductor layers are doped with given, desired or predetermined impurities, the semiconductor device 300 may be used as a template or basis for forming a light-emitting device.

When the nitride semiconductor layers are undoped, the semiconductor device 300 may be used as a template for forming a power device, a light-emitting device, or the like.

Figure 11:
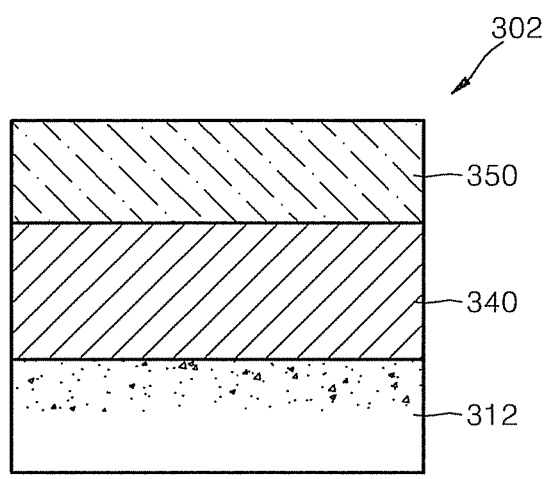
FIG. 11 is a schematic cross-sectional view of a semiconductor device according to another example embodiment.

FIG. 11 is a schematic view of a semiconductor device according to another example embodiment.

Referring to FIG. 11, the semiconductor device 302 includes: a silicon-based substrate 312 doped with a relatively high concentration of p-type impurities; a buffer layer 340; and the nitride stack 350. In the example embodiment shown in FIG. 11, the silicon-based substrate 312 is doped with a different type of impurities as compared to that of the silicon-based substrate 310 discussed above with regard to FIG. 10.

Moreover, the p-type impurities doped into the silicon-based substrate 312 are mainly or substantially distributed near an upper surface of the silicon-based substrate 312. In this example, the lower portion of the silicon-based substrate 312 may be undoped. The silicon-based substrate 312 may be obtained from a silicon wafer undoped or doped with a relatively low concentration of impurities by doping the silicon wafer with p-type impurities through ion implantation. The remaining elements in the semiconductor device 302 (e.g., the buffer layer 340 and the nitride stack 350) may be the same or substantially the same as those of the semiconductor device 300 described above with regard to FIG. 10.

The semiconductor device 302 shown in FIG. 11 may be used as a template for forming various semiconductor devices such as light-emitting devices, power devices, or the like.

Doping the silicon-based substrates 310 and 312 with p-type impurities at a relatively high concentration may reduce warping of the substrates during manufacturing. Generally, the amount of warping is represented by a bow measured at the wafer level. When the silicon-based substrate 310 and 312 is in a disk shape with a diameter of about 2", a bow of the silicon-based substrates 310 and 312 for semiconductor devices according to at least some example embodiments, (e.g., semiconductor devices 100, 200, 300, and/or 302) may be less than or equal to about 100 μm.

Figure 12:
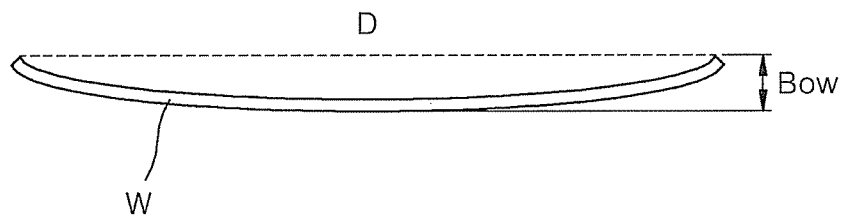
FIG. 12 is a schematic diagram showing an example bow in a wafer.

FIG. 12 is a schematic diagram viewing an example bow of a wafer. The amount of warping of a substrate occurring during a manufacturing process may be defined as a bow measured at a wafer level.

Referring to FIG. 12, a wafer W is a substrate and a thin film formed on the substrate. The bow may occur during a manufacturing process because of a difference between the thermal expansion coefficient of the substrate and the thermal coefficient of the thin film formed on the substrate. When the wafer is cooled to room temperature after a relatively high temperature process required for thin film growth, the substrate and the thin film contract at different levels due to the difference in their thermal expansion coefficients. This may cause the wafer W to warp. The amount of bow is generally defined by a distance in a thickness direction of the wafer W between the highest point and the lowest point of the wafer. The bow is proportional to the square of a diameter D of the wafer W under the same or substantially the same conditions. Accordingly, a substrate with a larger diameter may have a larger bow.

In FIG. 12, the bow of the wafer W has a concave shape. However, the shape of the bow may vary and depend on the thermal expansion coefficients of the substrate and the thin film, temperature variation, and/or stress conditions during the relatively high temperature process.

According to at least some example embodiments, the silicon-based substrates 310 and 312 may be doped with a relatively high concentration of p-type impurities to reduce the aforementioned bow phenomenon.

When using a conventional silicon substrate, which may be doped or undoped with n-type or p-type impurities at a relatively low concentration, a bow of tens to several hundreds of microns may be observed after growing a nitride semiconductor film. In this case, the bow appears to occur due to a plastic deformation of the silicon substrate. Conventionally, a thermal expansion coefficient of a silicon substrate is lower than a thermal expansion coefficient of a semiconductor film formed on the silicon substrate. The semiconductor film may contract more than the silicon substrate when cooling down to room temperature, and may cause the substrate to bow in a convex shape. Conventionally, a pressure on the order of a Giga Pascal (GPa) is applied during a relatively high temperature growth process to offset the tensile stress generated in the semiconductor film. Under such a high temperature and pressure, the silicon substrate may experience plastic deformation. In other words, a silicon substrate is brittle at room temperature, but becomes ductile at a high temperature. Therefore, the silicon substrate experiences plastic deformation when excessive stress is applied under a relatively high temperature and pressure. After the cooling process is performed and stress is removed, the silicon substrate does not return to its original state, but maintains the convex bow shape.

When silicon-based substrates 310 and 312 doped with p-type impurities at an appropriate concentration are used (e.g., as discussed above with regard to FIGS. 10 and 11), such a bow may be reduced.

Figure 13:
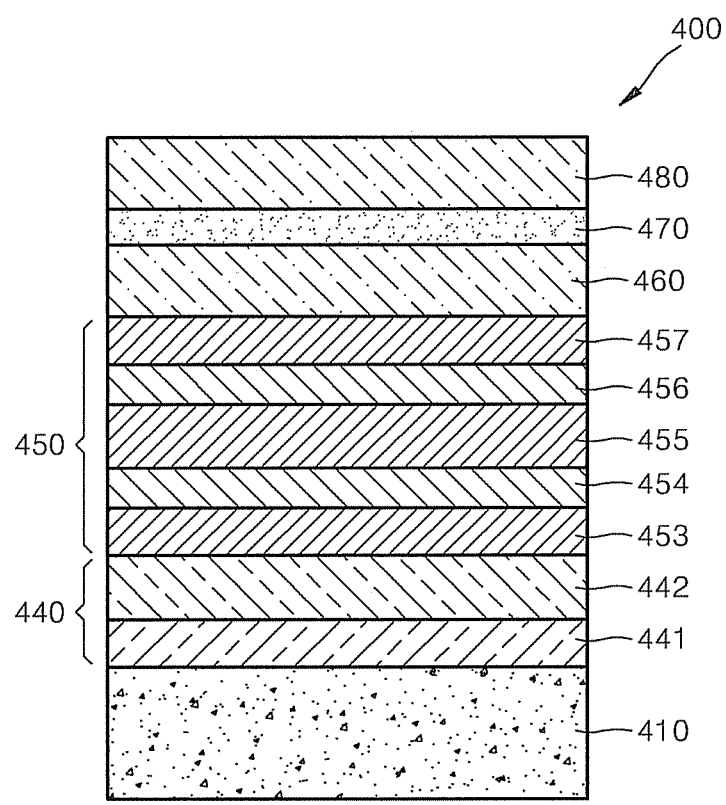
FIG. 13 is a cross-sectional view of a light-emitting device including the semiconductor device of FIG. 10.

FIG. 13 is a cross-sectional view of an example embodiment of a light-emitting device 400 including the semiconductor device 300 shown in FIG. 10.

Referring to FIG. 13, the light-emitting device 400 includes a silicon-based substrate 410, a buffer layer structure 440, a nitride stack 450, an n-type semiconductor layer 460, an active layer 470, and a p-type semiconductor layer 480. Positions of the n-type semiconductor layer 460 and the p-type semiconductor layer 480 may be varied.

In more detail with regard to FIG. 13, the buffer layer structure 440 is disposed on the silicon-based substrate 410. In this example, the buffer layer structure 440 includes a first buffer layer 441 and a second buffer layer 442 stacked sequentially on the silicon-based substrate 410.

The nitride stack 450 is disposed on the buffer layer structure 440. In this example, the nitride stack 450 includes a first nitride semiconductor layer 453, a masking layer 454, a second nitride semiconductor layer 455, an inter layer 456, and a third nitride semiconductor layer 457 disposed sequentially on the buffer layer structure 440. According to at least some example embodiments, the third nitride semiconductor layer 457 may be omitted.

Still referring to FIG. 13, the n-type semiconductor layer 460, the active layer 470, and the p-type semiconductor layer 480 are disposed sequentially on the nitride stack 450.

The following experimental results were obtained with regard to the example embodiment of the light-emitting device 400 shown in FIG. 13.

To obtain the experimental results, the silicon-based substrate 410 was a Si (111) substrate doped with boron (B) at a concentration of about $10^{19}$ cm$^{-3}$, and a resistivity of about 0.007 Ωcm, the first buffer layer 441 was formed of AlN as a nucleation-growth layer, and the second buffer layer 442 was formed of AlGaN. The first nitride semiconductor layer 453, the second nitride semiconductor layer 455, and the third nitride semiconductor layer 457 were formed of GaN. The masking layer 454 was formed of SiN, and the inter layer 456 was formed of AlGaN. The n-type semiconductor layer 460 was formed of n-GaN, and the p-type semiconductor layer 480 was formed of p-GaN. The active layer 470 was formed of GaN/InGaN to have a multi-quantum well structure.

The example results obtained by measuring light-emitting characteristics of the light-emitting device according to an example embodiment are shown in Table 1 along with example results obtained for a Comparative Example. In the Comparative Example, a conventional silicon substrate was doped with boron (B) at a concentration of about $4·10^{16}$ cm$^{-3}$, and a resistivity of about 15 Ωcm.

TABLE 1

| Wavelength | Comparative Example | Example Embodiment |
|---|---|---|
| Average (nm) | 449 | 448 |
| Standard deviation (nm) | 5.54 | 3.31 |
| Uniformity (%) | 1.2 | 0.7 |

Referring to Table 1, the standard deviation of the wavelength of emitted light of the light-emitting device according to an example embodiment was less than that of the Comparative Example. In addition, the uniformity in the light-emitting device according to an example embodiment was greater than that of the Comparative Example.

In a light-emitting structure employing a GaN/InGaN multi-quantum well structure, a distribution of the wavelength of emitted light is related to a uniformity of indium (In). In this structure, the wavelength of emitted light may be adjusted by changing a molar fraction of indium in an InGaN layer. For example, as the molar fraction of indium increases, the wavelength of emitted light may shift to a longer wavelength band. In the example embodiment discussed above with regard to Table 1, a distribution of the wavelength of emitted light was reduced, and a bow of a wafer in a template for forming the multi-quantum well structure was reduced. Moreover, the In was more uniformly distributed in the InGaN layer when growing the multi-quantum well structure.

When a bow of the wafer is relatively large, a temperature distribution of the substrate may be irregular, which may cause an irregular (e.g., non-uniformly distributed) In composition of the multi-quantum well structure.

Figure 14:
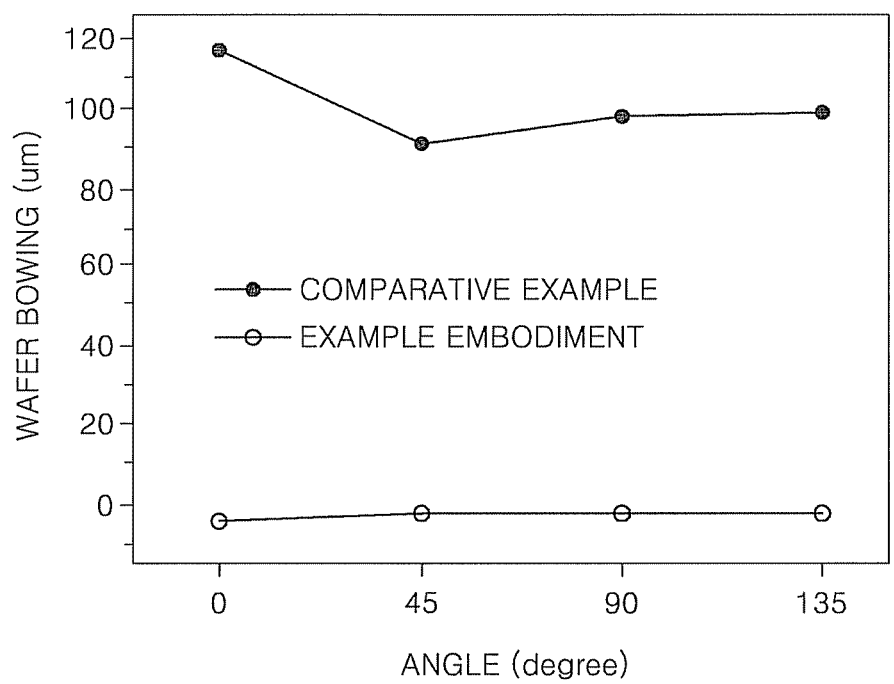
FIG. 14 is a graph illustrating an example relationship between a bow of a wafer and an angle in a light-emitting device according to a Comparative Example and a light-emitting device according to an example embodiment.

FIG. 14 is a graph illustrating an example relationship between a bow of a wafer and an angle (direction) for a light-emitting device according to the example embodiment discussed above with regard to Table 1 and a light-emitting device according to the Comparative Example.

Referring to FIG. 14, a bow in the light-emitting device of the Comparative Example using the conventional silicon substrate has a size of between about 80 μm and about 120 μm according to the angle. On the other hand, a bow in the light-emitting device according to at least this example embodiment has a relatively small (e.g., very small) bow of about several micrometers regardless of angle.

FIGS. 15A through 15E are cross-sectional views illustrating an example embodiment of a method of manufacturing a semiconductor device and devices including the semiconductor device. This example embodiment will be discussed with regard to the semiconductor device 300 of FIG. 10 for example purposes.

Figure 15A:
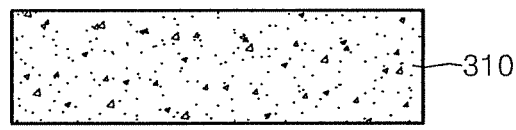
FIGS. 15A through 15E are cross-sectional views illustrating an example embodiment of a method of manufacturing a semiconductor device and a device including the semiconductor device.

Referring to FIG. 15A, the silicon-based substrate 310 is doped with a relatively high concentration of p-type impurities. The p-type impurities may be B, Al, Mg, Ca, Zn, Cd, Hg, Ga, or the like. The silicon-based substrate 310 may be a silicon substrate, a silicon carbide (SiC) substrate, or the like. The silicon-based substrate 310 may be formed by doping p-type impurities during silicon ingot growth. A doping concentration may be in a range of between about $5\times10^{17}$ cm$^{-3}$ and about $10^{20}$ cm$^{-3}$, inclusive, or between about $10^{18}$ cm$^{-3}$ and about $5\times10^{19}$ cm$^{-3}$, inclusive. Alternatively, a doping concentration may be determined such that the silicon-based substrate 310 has a resistivity less than or equal to about 1 Ωcm.

Figure 15B:
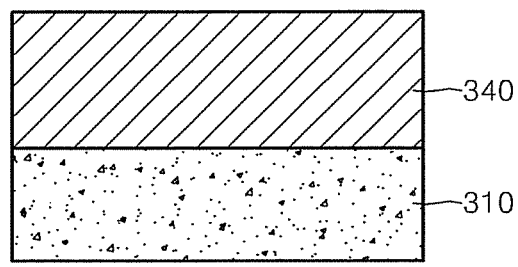

Referring to FIG. 15B, the buffer layer 340 is formed on the silicon-based substrate 310. The buffer layer 340 may have a single or multi-layer structure formed of AlN, SiC, Al$_2$O$_3$, AlGaN, AlInGaN, AlInBGaN, AlBGaN, GaN, a combination thereof, or the like. Alternatively, the buffer layer 340 having a single or multi-layer structure may be formed of a material combination of XY, where the X is at least one of Ti, Cr, Zr, Hf, Nb, Ta, or the like, and Y is at least one of nitrogen (N), boron (B, B$_2$), or the like.

Figure 15C:
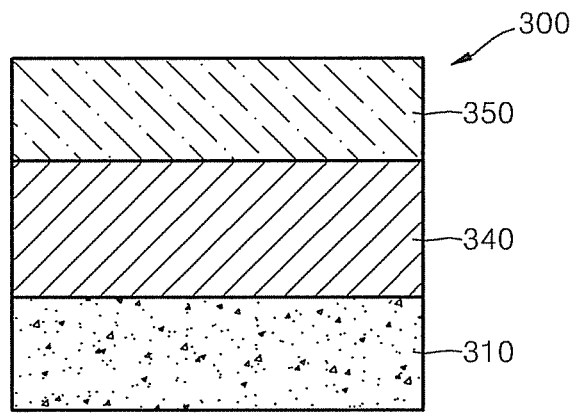

Referring to FIG. 15C, the nitride stack 350 is formed on the buffer layer 340. The nitride stack 350 may include a GaN-based compound semiconductor layer. The nitride stack 350 may be doped with given, desired or predetermined impurities, if necessary. For example, the nitride stack 350 may be doped with n-type impurities so that the semiconductor device 300 may be used as a template for manufacturing a light-emitting device. Alternatively, the nitride stack 350 may be undoped so that the semiconductor device 300 may be used as a template for manufacturing a power device.

The buffer layer 340 and the nitride stack 350 may be formed according to a conventional semiconductor manufacturing process, for example, a metal organic chemical vapor deposition (MOCVD) process. A total thickness of the buffer layer 340 and the nitride stack 350 may be determined such that a dislocation density remains less than or equal to an appropriate or desired level. For example, the total thickness of the buffer layer 340 and the nitride stack 350 may be greater than or equal to about 3 μm. A stress may be applied when growing the buffer layer 340 and the nitride stack 350 to offset a stress generated when cooling the buffer layer 340 and the nitride stack 350 to room temperature after a relatively high temperature process and due to a difference in thermal expansion coefficients between the silicon-based substrate 310, the buffer layer 340, and the nitride stack 350. For example, when thermal expansion coefficients of the buffer layer 340 and the nitride stack 350 are higher than a thermal expansion coefficient of the silicon-based substrate 310, compressive stress may be applied during a relatively high temperature process to offset a tensile stress generated during cooling.

The semiconductor device 300 illustrated in FIG. 15C may be used as a template for forming various semiconductor devices.

Figure 15D:
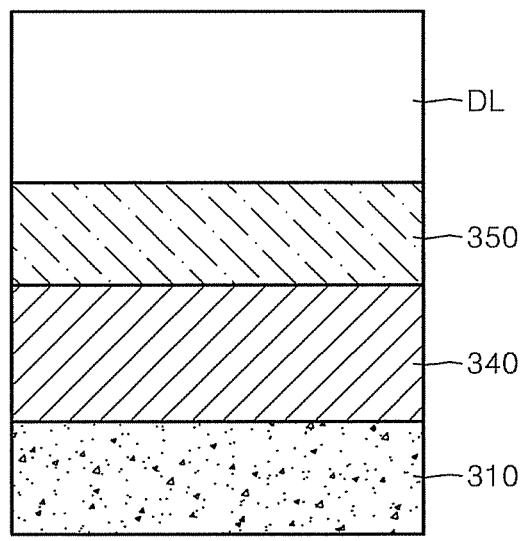

For example, referring to FIG. 15D, a device layer DL may be formed on the nitride stack 350. The device layer DL may include a plurality of thin film layers formed of suitable materials depending on the device to be manufactured. Examples of the device to be manufactured are a light-emitting diode (LED) device, a power device including a high electron mobility transistor (HEMT), a laser diode (LD) device, etc.

Figure 15E:
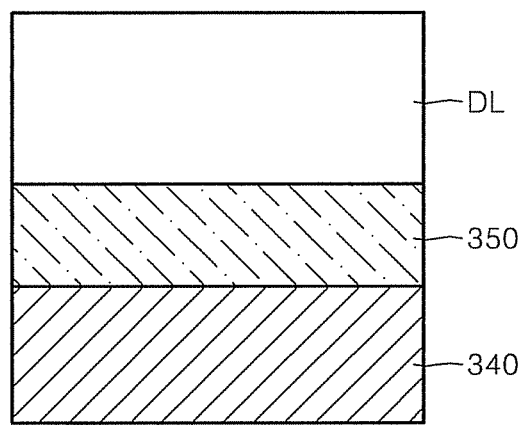

Referring to FIG. 15E, the silicon-based substrate 310 may be removed using, for example, a grinding process and a wet etching process, or a dry etching process. However, example embodiments are not limited to these examples.

FIGS. 16A through 16F are cross-sectional views for explaining an example embodiment of a method of manufacturing a semiconductor device and devices including the semiconductor device. FIGS. 16A through 16F will be described with regard to the semiconductor device 302 shown in FIG. 11.

Figure 16A:
FIGS. 16A through 16F are cross-sectional views illustrating an example embodiment of a method of manufacturing a semiconductor device and devices including the semiconductor device.

Referring to FIG. 16A, a substrate 310' is prepared. The substrate 310' may be a silicon substrate, a silicon carbide (SIC) substrate, or the like.

Figure 16B:
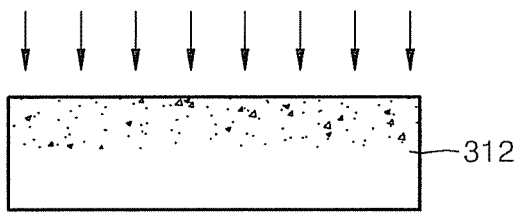
Figure 16C:
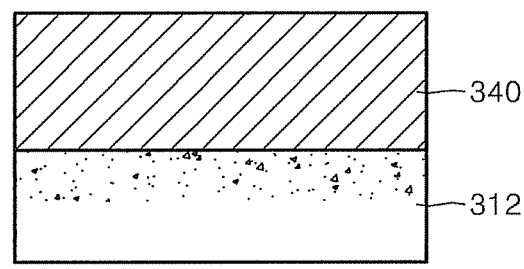
Figure 16D:
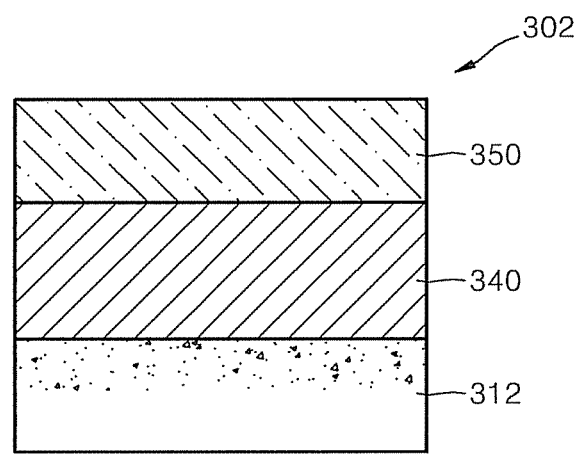
Figure 16E:
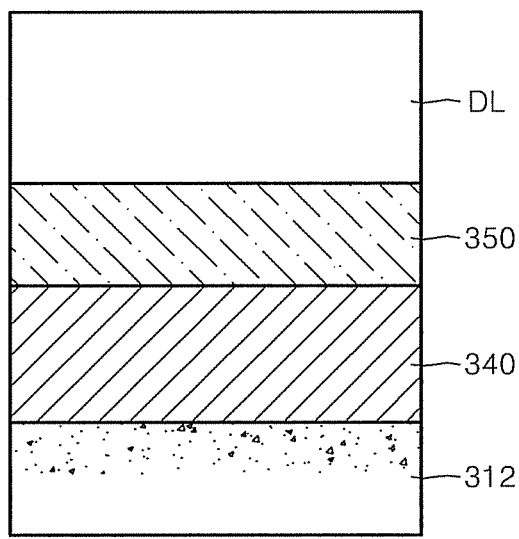
Figure 16F:
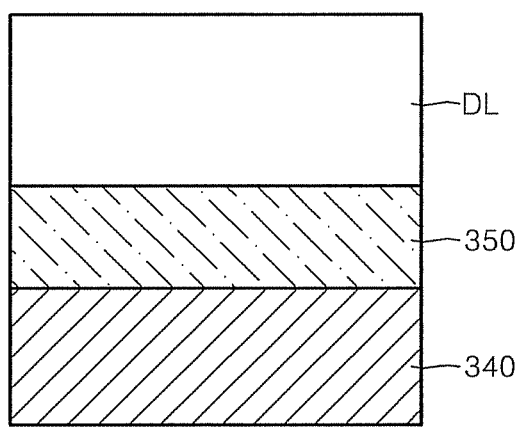

Referring to FIG. 16B, the substrate 310' is doped with a relatively high concentration of p-type impurities using ion implantation to form a silicon-based substrate 312. The p-type impurities may include B, Al, Mg, Ca, Zn, Cd, Hg, Ga, or the like. According to at least this example embodiment, the p-type impurities are distributed mainly or substantially near or at an upper surface of the silicon-based substrate 312. The processes illustrated in FIGS. 16C through 16F may be the same or substantially the same as those described above with regard to FIGS. 15B through 15E, and thus, a detailed description is omitted. That is, for example, the buffer layer 340, the nitride stack 350, and the device layer DL may be formed sequentially on the silicon-based substrate 312, and the silicon-based substrate 312 may be removed.

When using the silicon-based substrates 310 and 312 doped with p-type impurities at a concentration greater than or equal to a given, desired or predetermined concentration, a plastic deformation on the silicon-based substrates 310 and 312 may not occur after a relatively high pressure and temperature process. As a result, bow may be reduced and a higher quality thin film may be obtained. Therefore, semiconductor devices 300 and 302 according to at least some example embodiments may be used as templates for manufacturing various types of electronic devices, for example, high quality light-emitting devices, power devices, etc.

An example embodiment of a method of manufacturing the light-emitting device on such a template will be discussed with reference to FIGS. 17A through 17D. The example embodiment shown in FIGS. 17A through 17D will be described with regard to the light-emitting device 400 shown in FIG. 13.

In at least this example embodiment, a light-emitting device layer is grown on a template of a wafer. Isolation etching is then performed on the wafer. A dielectric material acting as a chip passivation and current blocking layer (CBL) is deposited and then patterned. The resultant structure is shown in FIG. 17A.

Figure 17A:
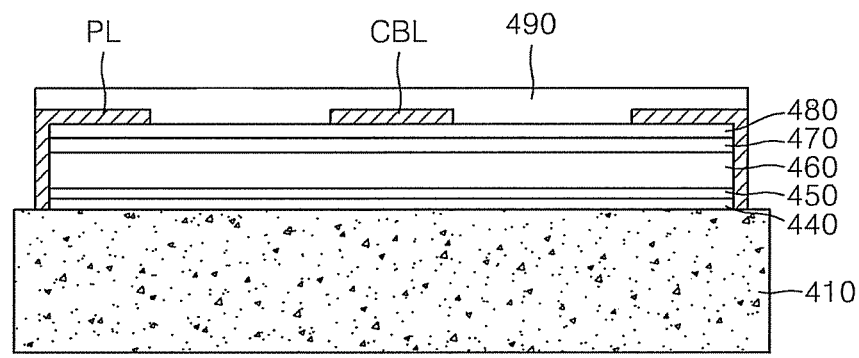
FIGS. 17A through 17D are cross-sectional views illustrating a method of manufacturing the light-emitting device of FIG. 13 according to an example embodiment.

In more detail with regard to FIG. 17A, the buffer layer structure 440, the nitride stack 450, the n-type semiconductor layer 460, the active layer 470, and the p-type semiconductor layer 480 are formed on the silicon-based substrate 410. The silicon-based substrate 410 may be doped with a relatively high concentration of p-type impurities.

A passivation layer PL and a current blocking layer CBL formed of a dielectric material may be formed according to a given, desired or predetermined pattern. The buffer layer structure 440 and the nitride stack 450 may have the same or substantially the same structure as that of the buffer layer structure 440 and the nitride stack 450 described above with regard to FIGS. 10 and/or 13.

A metal layer 490 having a p-ohmic contact function and a reflection function may be deposited on the p-type semiconductor layer 480 and the current blocking layer CBL.

Figure 17B:
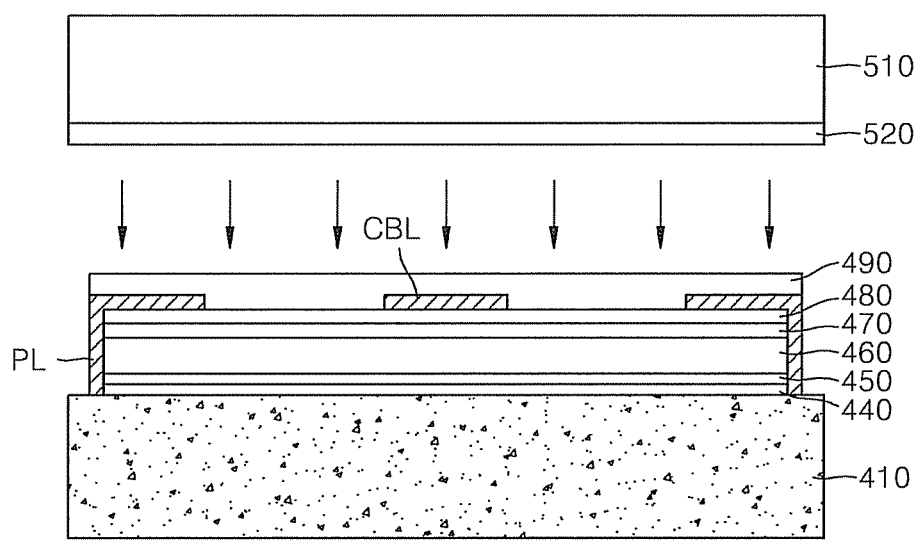

Referring to FIG. 17B, a sub-mount 510 is adhered to the structure shown in FIG. 17A. The sub-mount 510 may be a Si (100) or similar substrate. A bonding metal layer 520 may be formed on a surface of the sub-mount 510 for bonding with the metal layer 490. The bonding metal layer 520 and the metal layer 490 may be eutectically bonded to each other at a temperature greater than or equal to about 300° C.

Figure 17C:
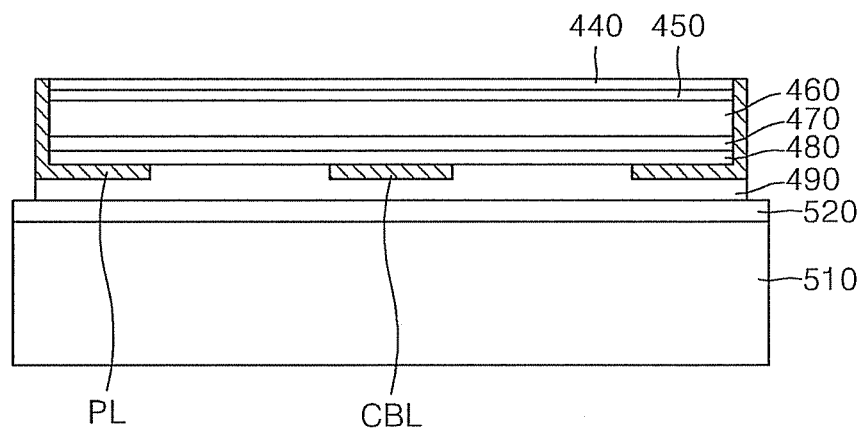

Referring to FIG. 17C, the silicon-based substrate 410 may be removed by, for example, a grinding process and a wet etching process, or a dry etching process. However, example embodiments are not limited to these examples. In FIG. 17C, the sub-mount 510 is located below the structure shown in FIG. 17A, rather than above the structure as shown in FIG. 17B. In FIG. 17C, the structure shown in FIG. 17A is flipped.

Figure 17D:
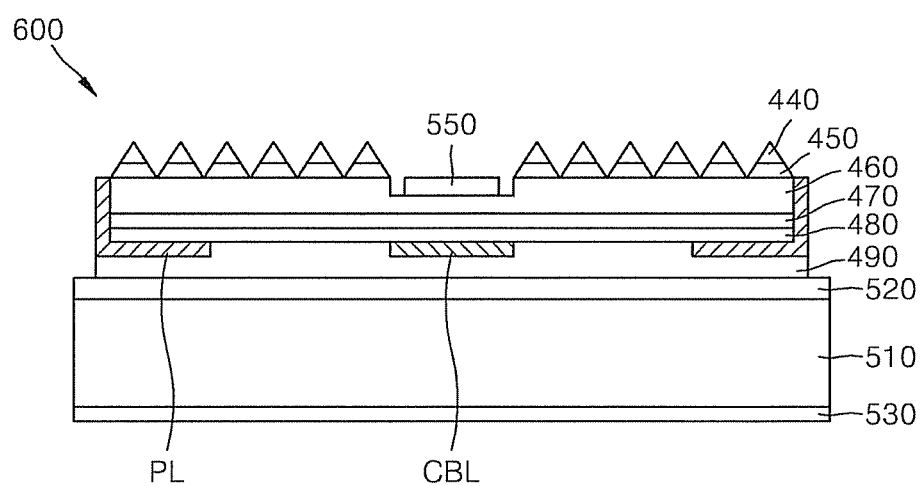

As shown in FIG. 17D, a texturing process may be performed on a surface, which was initially interfaced with the removed silicon-based substrate. Texturing the surface may improve light emission efficiency of the active layer 470.

The buffer layer structure 440 and the nitride stack 450 being textured are then partially removed to expose a portion of the n-type semiconductor layer 460. A metal layer 550 for n-ohmic contact is formed on at least a portion of the exposed portion of the n-type semiconductor layer 460. Also, a vertical light-emitting device 600 is formed by forming an electrode layer 530 for applying a voltage on a bottom surface of the sub-mount 510.

While example embodiments have been particularly shown and described with reference to the figures and using specific terms, example embodiments and terms used herein should not be construed as limiting the scope of the claims. Accordingly, it will be understood by those of ordinary skill in the art that various changes in form and details may be made therein without departing from the spirit and scope defined by the following claims.

What is claimed is:

1. A semiconductor device comprising:
    a plurality of nitride semiconductor layers on a substrate;
    at least one masking layer between a first pair of the nitride semiconductor layers, the first pair of nitride semiconductor layers including a first nitride semiconductor layer and a second nitride semiconductor layer; and
    an inter layer between a second pair of the nitride semiconductor layers, the second pair of nitride semiconductor layers including the second nitride semiconductor layer and a third nitride semiconductor layer directly on the inter layer, the inter layer being on the at least one masking layer, the third nitride semiconductor layer located farther from the masking layer than the second nitride semiconductor layer, wherein
        the inter layer is formed of one of $Al_{x0}In_{y0}Ga_{1-x0-y0}N$ ($0 \leq x0 \leq 1$, $0 \leq y0 \leq 1$, $x0+y0 \leq 1$), $Al_xGa_{1-x}N$ ($0.4 < x < 1$), step-graded $Al_xIn_yGa_{1-x-y}N$ ($0 \leq x \leq 1$, $0 \leq y \leq 1$, $x+y \leq 1$), and $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$ or $y1 \neq y2$),
    the inter layer is configured to apply a compressive stress to the third nitride semiconductor layer directly on the inter layer by a lattice mismatch between the inter layer and the third nitride semiconductor layer, the lattice mismatch counteracting a tensile stress between the second nitride semiconductor layer and the substrate.

2. The semiconductor device of claim 1, wherein each of the plurality of nitride semiconductor layers is formed of a nitride including gallium.

3. The semiconductor device of claim 1, wherein each of the plurality of nitride semiconductor layers is formed of $Al_xIn_yGa_{1-x-y}N$ ($0 \leq x \leq 1$, $0 \leq y \leq 1$, $x+y < 1$).

4. The semiconductor device of claim 1, wherein the at least one masking layer is formed of a silicon nitride or a titanium nitride.

5. The semiconductor device of claim 1, wherein the inter layer is formed of one of $Al_xGa_{1-x}N$ ($0.4 < x < 1$) and the inter layer has a thickness in a range of 10 nm-100 nm.

6. The semiconductor device of claim 1, wherein the substrate is a silicon substrate or a silicon carbide substrate.

7. The semiconductor device of claim 1, further comprising:
    at least one buffer layer between the substrate and the plurality of nitride semiconductor layers.

8. The semiconductor device of claim 7, wherein the at least one buffer layer includes a nucleation-growth layer.

9. The semiconductor device of claim 8, wherein the nucleation-growth layer is formed of aluminum nitride (AlN).

10. The semiconductor device of claim 7, wherein the at least one buffer layer is formed of $Al_xIn_yGa_{1-x-y}N$ ($0 \leq x \leq 1$, $0 \leq y \leq 1$, $x+y \leq 1$).

11. The semiconductor device of claim 7, wherein the at least one buffer layer has a step-graded structure or a superlattice structure.

12. The semiconductor device of claim 11, wherein the at least one buffer layer is formed of step-graded $Al_xIn_yGa_{1-x-y}N$ ($0 \leq x \leq 1$, $0 \leq y \leq 1$, $x+y \leq 1$), or $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$ or $y1 \neq y2$) superlattices.

13. The semiconductor device of claim 1, further comprising:
    one or more pairs of the at least one masking layer and the inter layer.

14. The semiconductor device of claim 1, further comprising:
    at least one other inter layer; wherein
        the at least one masking layer is on the at least one other inter layer.

15. The semiconductor device of claim 1, further comprising:
    at least one nitride semiconductor layer on the inter layer; and
    at least one other inter layer; wherein the plurality of nitride semiconductor layers are on the at least one other inter layer.

16. A semiconductor device comprising:
a first nitride semiconductor layer on a substrate;
a first masking layer on the first nitride semiconductor layer;
a second nitride semiconductor layer on the first masking layer;
a first inter layer on the second nitride semiconductor layer; and
a third nitride semiconductor layer directly on the first inter layer, wherein
the first inter layer is formed of one of $Al_{x0}In_{y0}Ga_{1-x0-y0}N$ ($0 \leq x0 \leq 1$, $0 \leq y0 \leq 1$, $x0+y0 \leq 1$), $Al_xGa_{1-x}N$ ($0.4 < x < 1$), step-graded $Al_xIn_yGa_{1-x-y}N$ ($0 \leq x \leq 1$, $0 \leq y \leq 1$, $x+y \leq 1$), and $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$ or $y1 \neq y2$) superlattices,
the first inter layer is configured to apply a compressive stress to the third nitride semiconductor layer directly on the first inter layer by a lattice mismatch between the first inter layer and the third nitride semiconductor layer, the lattice mismatch counteracting a tensile stress between the second nitride semiconductor layer and the substrate.

17. The semiconductor device of claim 16, wherein each of the first, second, and third nitride semiconductor layers are formed of a nitride including gallium.

18. The semiconductor device of claim 16, wherein each of the first, second, and third nitride semiconductor layers are formed of $Al_xIn_yGa_{1-x-y}N$ ($0 \leq x \leq 1$, $0 \leq y \leq 1$, $x+y < 1$).

19. The semiconductor device of claim 16, wherein the first masking layer includes a silicon nitride or a titanium nitride.

20. The semiconductor device of claim 16, further comprising:
at least one buffer layer on the first nitride semiconductor layer.

21. The semiconductor device of claim 16, wherein the first nitride semiconductor layer and the second nitride semiconductor layer are formed of the same elements.

22. The semiconductor device of claim 16, wherein the substrate is a silicon substrate or a silicon carbide substrate.

23. The semiconductor device of claim 16, further comprising:
at least one buffer layer between the substrate and the first nitride semiconductor layer.

24. The semiconductor device of claim 23, wherein the at least one buffer layer is formed of $Al_xIn_yGa_{1-x-y}N$ ($0 \leq x \leq 1$, $0 \leq y \leq 1$, $x+y \leq 1$).

25. The semiconductor device of claim 23, wherein the at least one buffer layer has a step-graded structure or a superlattice structure.

26. The semiconductor device of claim 25, wherein the at least one buffer layer is formed of step-graded $Al_xIn_yGa_{1-x-y}N$ ($0 \leq x \leq 1$, $0 \leq y \leq 1$, $x+y \leq 1$), or $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$ or $y1 \neq y2$) superlattice.

27. The semiconductor device of claim 16, wherein the first inter layer is formed of $Al_xGa_{1-x}$ ($0.4 < x < 1$) and the first inter layer has a thickness in a range of 10 nm-100 nm.

28. The semiconductor device of claim 16, further comprising:
at least one second inter layer on the third nitride semiconductor layer; and
at least one fourth nitride semiconductor layer on the second inter layer.

29. The semiconductor device of claim 16, further comprising:
at least one second inter layer; wherein
the first nitride semiconductor layer is on the at least one second inter layer.

30. The semiconductor device of claim 29, further comprising:
at least one fourth nitride semiconductor layer; wherein
the at least one second inter layer is on the at least one fourth nitride semiconductor layer.

31. The semiconductor device of claim 16, further comprising:
an active layer on the third nitride semiconductor layer; and
a fourth nitride semiconductor layer on the active layer.

32. The semiconductor device of claim 31, wherein the fourth nitride semiconductor layer is doped with p-type impurities.

33. The semiconductor device of claim 16, wherein the third nitride semiconductor layer is doped with n-type impurities.

34. The semiconductor device of claim 16, further comprising:
at least one second inter layer and at least one fourth nitride semiconductor layer stacked alternately between the first nitride semiconductor layer and the first masking layer.

* * * * *